(12) United States Patent
Hareland et al.

(10) Patent No.: US 7,456,476 B2
(45) Date of Patent: Nov. 25, 2008

(54) NONPLANAR SEMICONDUCTOR DEVICE WITH PARTIALLY OR FULLY WRAPPED AROUND GATE ELECTRODE AND METHODS OF FABRICATION

(75) Inventors: Scott A. Hareland, Tigard, OR (US); Robert S. Chau, Beaverton, OR (US); Brian S. Doyle, Portland, OR (US); Rafael Rios, Portland, OR (US); Tom Linton, San Jose, CA (US); Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 10/607,769

(22) Filed: Jun. 27, 2003

(65) Prior Publication Data

US 2006/0172497 A1     Aug. 3, 2006

(51) Int. Cl.
*H01L 29/786* (2006.01)
(52) U.S. Cl. ............... 257/349; 438/284; 257/E29.242; 257/E29.273
(58) Field of Classification Search ......... 257/345–354, 257/327, E29.242, E29.255, E29.264, E29.273, 257/E29.275, E29.276; 438/151, 157, 164, 438/280, 283, 284
See application file for complete search history.

(56) References Cited

U.S. PATENT DOCUMENTS

| | | | |
|---|---|---|---|
| 4,487,652 A | 12/1984 | Almgren | |
| 4,818,715 A | 4/1989 | Chao | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki et al. | |
| 5,124,777 A | 6/1992 | Lee | |
| 5,308,999 A * | 5/1994 | Gotou | ............... 257/66 |

(Continued)

FOREIGN PATENT DOCUMENTS

DE     102 03 9978 A1     8/2003

(Continued)

OTHER PUBLICATIONS

International Search Report PCT/US 03/40320.

(Continued)

*Primary Examiner*—Douglas M. Menz
*Assistant Examiner*—Matthew W Such
(74) *Attorney, Agent, or Firm*—Blakely, Sokoloff, Taylor & Zafman LLP

(57) ABSTRACT

A nonplanar semiconductor device and its method of fabrication is described. The nonplanar semiconductor device includes a semiconductor body having a top surface opposite a bottom surface formed above an insulating substrate wherein the semiconductor body has a pair laterally opposite sidewalls. A gate dielectric is formed on the top surface of the semiconductor body on the laterally opposite sidewalls of the semiconductor body and on at least a portion of the bottom surface of semiconductor body. A gate electrode is formed on the gate dielectric, on the top surface of the semiconductor body and adjacent to the gate dielectric on the laterally opposite sidewalls of semiconductor body and beneath the gate dielectric on the bottom surface of the semiconductor body. A pair source/drain regions are formed in the semiconductor body on opposite sides of the gate electrode.

12 Claims, 12 Drawing Sheets

U.S. PATENT DOCUMENTS

| | | | |
|---|---|---|---|
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A * | 1/1996 | Rhee | 438/157 |
| 5,514,885 A * | 5/1996 | Myrick | 257/216 |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,578,513 A * | 11/1996 | Maegawa | 438/151 |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,701,016 A | 12/1997 | Burroughs et al. | |
| 5,716,879 A | 2/1998 | Choi et al. | |
| 5,739,544 A | 4/1998 | Yuki et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A * | 9/1998 | Yang | 438/159 |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,880,015 A | 3/1999 | Hata | |
| 5,888,309 A | 3/1999 | Yu | |
| 5,899,710 A | 5/1999 | Mukai | |
| 5,905,285 A | 5/1999 | Gardner et al. | |
| 5,952,701 A | 9/1999 | Bulucea et al. | |
| 5,965,914 A * | 10/1999 | Miyamoto | 257/331 |
| 6,018,176 A | 1/2000 | Lim | |
| 6,031,249 A | 2/2000 | Yamazaki et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,117,741 A | 9/2000 | Chatterjee et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A | 12/2000 | Kawashima | |
| 6,165,880 A | 12/2000 | Yaung et al. | |
| 6,190,975 B1 | 2/2001 | Kubo et al. | |
| 6,218,309 B1 | 4/2001 | Miller et al. | |
| 6,251,729 B1 | 6/2001 | Montree et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,274,503 B1 | 8/2001 | Hsieh | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,335,251 B2 | 1/2002 | Miyano et al. | |
| 6,359,311 B1 | 3/2002 | Colinge et al. | |
| 6,362,111 B1 | 3/2002 | Laaksonen et al. | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,458,662 B1 | 10/2002 | Yu | |
| 6,459,123 B1 | 10/2002 | Enders et al. | |
| 6,472,258 B1 | 10/2002 | Adkisson et al. | |
| 6,475,869 B1 * | 11/2002 | Yu | 438/303 |
| 6,475,890 B1 | 11/2002 | Yu | |
| 6,483,146 B2 | 11/2002 | Lee et al. | |
| 6,483,156 B1 | 11/2002 | Adkisson et al. | |
| 6,495,403 B1 * | 12/2002 | Skotnicki et al. | 438/157 |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,525,403 B2 | 2/2003 | Inaba et al. | |
| 6,534,807 B2 | 3/2003 | Mandelman et al. | |
| 6,537,885 B1 | 3/2003 | Kang et al. | |
| 6,562,665 B1 | 5/2003 | Yu | |
| 6,583,469 B1 | 6/2003 | Fried et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,642,114 B2 | 11/2003 | Nakamura | |
| 6,645,797 B1 | 11/2003 | Buynoski et al. | |
| 6,645,826 B2 | 11/2003 | Yamazaki et al. | |
| 6,656,853 B2 | 12/2003 | Ito | |
| 6,657,259 B2 | 12/2003 | Fried et al. | |
| 6,664,160 B2 | 12/2003 | Park et al. | |
| 6,680,240 B1 | 1/2004 | Maszara | |
| 6,686,231 B1 | 2/2004 | Ahmed et al. | |
| 6,689,650 B2 | 2/2004 | Gambino et al. | |
| 6,693,324 B2 | 2/2004 | Maegawa et al. | |
| 6,696,366 B1 | 2/2004 | Morey et al. | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,686 B1 | 4/2004 | Buynoski et al. | |
| 6,716,690 B1 | 4/2004 | Wang et al. | |
| 6,730,964 B2 | 5/2004 | Horiuchi | |
| 6,744,103 B2 | 6/2004 | Snyder | |
| 6,756,657 B1 | 6/2004 | Zhang et al. | |
| 6,762,469 B2 | 7/2004 | Mocuta et al. | |
| 6,764,884 B1 | 7/2004 | Yu et al. | |
| 6,770,516 B2 | 8/2004 | Wu et al. | |
| 6,774,390 B2 | 8/2004 | Sugiyama et al. | |
| 6,787,402 B1 | 9/2004 | Yu | |
| 6,787,439 B2 | 9/2004 | Ahmed et al. | |
| 6,787,845 B2 | 9/2004 | Deleonibus | |
| 6,787,854 B1 | 9/2004 | Yang et al. | |
| 6,790,733 B1 | 9/2004 | Natzle et al. | |
| 6,794,313 B1 | 9/2004 | Chang | |
| 6,794,718 B2 | 9/2004 | Nowak et al. | |
| 6,798,000 B2 | 9/2004 | Luyken et al. | |
| 6,800,885 B1 | 10/2004 | An et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,812,111 B2 | 11/2004 | Cheong et al. | |
| 6,815,277 B2 | 11/2004 | Fried et al. | |
| 6,821,834 B2 | 11/2004 | Ando | |
| 6,833,588 B2 | 12/2004 | Yu et al. | |
| 6,835,614 B2 | 12/2004 | Hanafi et al. | |
| 6,835,618 B1 | 12/2004 | Dakshina-Murthy | |
| 6,838,322 B2 | 1/2005 | Pham et al. | |
| 6,844,238 B2 | 1/2005 | Yeo et al. | |
| 6,849,556 B2 | 2/2005 | Takahashi | |
| 6,849,884 B2 | 2/2005 | Clark et al. | |
| 6,855,606 B2 | 2/2005 | Chen et al. | |
| 6,855,990 B2 | 2/2005 | Yeo et al. | |
| 6,858,478 B2 | 2/2005 | Chau et al. | |
| 6,867,433 B2 | 3/2005 | Yeo et al. | |

| | | |
|---|---|---|
| 6,867,460 B1 | 3/2005 | Anderson et al. |
| 6,869,868 B2 | 3/2005 | Chiu et al. |
| 6,884,154 B2 | 4/2005 | Mizushima et al. |
| 6,885,055 B2 | 4/2005 | Lee |
| 6,897,527 B2 | 5/2005 | Dakshina-Murthy et al. |
| 6,902,962 B2 | 6/2005 | Yeo et al. |
| 6,909,151 B2 | 6/2005 | Hareland et al. |
| 6,919,238 B2 * | 7/2005 | Bohr ........................ 438/166 |
| 6,921,691 B1 | 7/2005 | Li et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,960,517 B2 | 11/2005 | Rios et al. |
| 6,967,351 B2 | 11/2005 | Fried et al. |
| 6,974,738 B2 | 12/2005 | Hareland |
| 7,018,551 B2 | 3/2006 | Beintner et al. |
| 7,045,401 B2 | 5/2006 | Lee et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,105,390 B2 | 9/2006 | Brask et al. |
| 7,105,891 B2 | 9/2006 | Visokay |
| 7,105,894 B2 | 9/2006 | Yeo et al. |
| 7,112,478 B2 | 9/2006 | Grupp et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Abadeer et al. |
| 7,183,137 B2 | 2/2007 | Lee et al. |
| 7,187,043 B2 | 3/2007 | Arai et al. |
| 7,241,653 B2 | 7/2007 | Hareland et al. |
| 7,250,645 B1 | 7/2007 | Wang et al. |
| 2001/0019886 A1 | 9/2001 | Bruce et al. |
| 2002/0011612 A1 | 1/2002 | Hieda |
| 2002/0036290 A1 | 3/2002 | Inaba et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0149031 A1 * | 10/2002 | Kim et al. .................... 257/192 |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177282 A1 * | 11/2002 | Song .......................... 438/300 |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Leong et al. |
| 2003/0085194 A1 | 5/2003 | Hopkins, Jr. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0201458 A1 | 10/2003 | Clark et al. |
| 2003/0227036 A1 | 12/2003 | Sugiyama et al. |
| 2004/0016968 A1 * | 1/2004 | Coronel et al. ............. 257/347 |
| 2004/0031979 A1 | 2/2004 | Lochtefeld et al. |
| 2004/0033639 A1 | 2/2004 | Chinn et al. |
| 2004/0036118 A1 | 2/2004 | Adadeer et al. |
| 2004/0036126 A1 | 2/2004 | Chau et al. |
| 2004/0036127 A1 | 2/2004 | Chau et al. |
| 2004/0061178 A1 | 4/2004 | Lin et al. |
| 2004/0070020 A1 | 4/2004 | Fujiwara et al. |
| 2004/0075149 A1 | 4/2004 | Fitzgerald et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0110097 A1 | 6/2004 | Ahmed et al. |
| 2004/0119100 A1 | 6/2004 | Nowal et al. |
| 2004/0126975 A1 | 7/2004 | Ahmed et al. |
| 2004/0145019 A1 | 7/2004 | Dakshina-Murthy |
| 2004/0166642 A1 | 8/2004 | Chen et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conley et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0017377 A1 | 1/2005 | Joshi et al. |
| 2005/0019993 A1 | 1/2005 | Lee et al. |
| 2005/0035415 A1 | 2/2005 | Yeo et al. |
| 2005/0093067 A1 | 5/2005 | Yeo et al. |
| 2005/0093154 A1 | 5/2005 | Kottantharayil et al. |
| 2005/0118790 A1 | 6/2005 | Lee et al. |
| 2005/0127362 A1 | 6/2005 | Zhang et al. |
| 2005/0139860 A1 | 6/2005 | Synder et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0156171 A1 | 7/2005 | Brask et al. |
| 2005/0156202 A1 | 7/2005 | Rhee et al. |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim |
| 2005/0191795 A1 | 9/2005 | Chidambarrao et al. |
| 2005/0199919 A1 | 9/2005 | Liu |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert |
| 2005/0227498 A1 | 10/2005 | Furukawa et al. |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0277294 A1 | 12/2005 | Schaefer et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0071299 A1 | 4/2006 | Doyle et al. |
| 2006/0154478 A1 | 7/2006 | Hsu et al. |
| 2006/0172480 A1 | 8/2006 | Wang et al. |
| 2006/0202270 A1 | 9/2006 | Son et al. |
| 2006/0281325 A1 | 12/2006 | Chou et al. |
| 2007/0001219 A1 | 1/2007 | Radosavljevic et al. |
| 2007/0045748 A1 | 3/2007 | Booth, Jr. et al. |
| 2007/0093010 A1 | 4/2007 | Mathew et al. |

FOREIGN PATENT DOCUMENTS

| | | |
|---|---|---|
| DE | 10203998 | 8/2003 |
| EP | 0 623 963 A1 | 11/1994 |
| EP | 1091413 | 4/2001 |
| EP | 1 202 335 A | 5/2002 |
| EP | 1202335 | 5/2002 |
| EP | 1 566 844 A2 | 8/2005 |
| GB | 2 156 149 | 10/1985 |
| JP | 56073454 | 6/1981 |
| JP | 59 145538 A | 8/1984 |
| JP | 02 303 048 A | 12/1990 |
| JP | 06005856 | 1/1994 |

| | | |
|---|---|---|
| JP | 6151387 | 5/1994 |
| JP | 0 617 7089 | 6/1994 |
| JP | 06177089 | 6/1994 |
| JP | 2001338987 | 12/2001 |
| JP | 2002298051 | 10/2003 |
| JP | 2003298051 | 10/2003 |
| WO | WO 02/43151 A | 5/2002 |
| WO | WO03003442 | 1/2003 |
| WO | WO 2004/059726 A1 | 7/2004 |
| WO | PCT/US2004032442 | 9/2004 |
| WO | WO2005036651 | 4/2005 |
| WO | PCT/US2006/00378 | 1/2006 |
| WO | PCT/US2006/024516 | 6/2006 |
| WO | PCT/US2006/037643 | 9/2006 |

OTHER PUBLICATIONS

V. Subramanian et al., "A Bulk-Si-Compatible Ultrathin-body SOI Technology for Sub-100m MOSFETS" Proceeding of the 57th Annual Device Research Conference, pp. 28-29 (1999).
Hisamoto et al., "A Folded-channel MOSFET for Deepsub-tenth Micron Era", 1998 IEEE International Electron Device Meeting Technical Digest, pp. 1032-1034 (1998).
Huang et al., "Sub 50-nm FinFET: PMOS", 1999 IEEE International Electron Device Meeting Technical Digest, pp. 67-70 (1999).
Auth et al., "Vertical, Fully-Depleted, Surroundings Gate MOSFETS On sub-0.1um Thick Silicon Pillars", 1996 54th Annual Device Research Conference Digest, pp. 108-109 (1996).
Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).
Jong-Tae Park et al., "Pi-Gate SOI MOSFET" IEEE Electron Device Letters, vol. 22, No. 8, Aug. 2001, pp. 405-406.
Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.
International Search Report PCT/US 03/26242.
International Search Report PCT/US 03/39727.
International Search Report PCT/US 03/40320.
Burenkov, A. et al., "Corner Effect in Double and Triple Gate FINFETs", European Solid-State Device Research, 2003 33rd Conference on Essderc '03 Sep. 2003, Piscataway, NJ, USA, IEEE, pp. 135-138, XP010676716.
Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177, XP010687197.
International Search Report PCT/US2005/010505.
International Search Report PCT/US2005/000947, Int'l. filing date Jan. 10, 2005, mailed May 3, 2005 (7 pages).
T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.
Jing Guo, et al. "Performance Projections for Ballistic Carbon Nanotube Field-Effect Transistors", Applied Physics Letters, vol. 80, No. 17, pp. 3192-3194 (Apr. 29, 2004).
Ali Javey, et al., "High-K Dielectrics for Advanced Carbon-Nanotube Transistors and Logic Gates", Advance Online Publication, Published online, pp. 1-6 (Nov. 17, 2002).
Richard Martel, et al., "Carbon Nanotube Field Effect Transistors for Logic Applications" IBM, T.J. Watson Research Center, 2001 IEEE, IEDM 01, pp. 159-162.
David M. Fried, et al., "High-Performance P-Type Independent-Gate FinFETs, IEEE Electron Device Letters", vol. 25, No. 4, Apr. 2004, pp. 199-201.
David M. Fried, et al., "Improved Independent Gate N-Type FinFET Fabrication and Characterization", IEEE Electron Device Letters, vol. 24, No. 9, Sep. 2003, pp. 592-594.
Charles Kuo, et al. "A Capacitorless Double Gate DRAM Technology for Sub-100-nm Embedded and Stand-Alone Memory Applications", IEEE Transactions on Electron Devices, vol. 50, No. 12, Dec. 2003, pp. 2408-2416.
Charles Kuo, et al., "A Capacitorless Double-Gate DRAM Cell Design for High Density Applications", 2002 IEEE International Electron Devices Meeting Technical Digest, Dec. 2002, pp. 843-846.
Takashi Ohsawa, et al., "Memory Design Using a One-Transistor Gain Cell on SOI", IEEE Journal of Solid-State Circuits, vol. 37, No. 11, Nov. 2002, pp. 1510-1522.
T. Tanaka, et al., "Scalability Study on a Capacitorless 1T-DRAM: From Single-Gate PD-SOI to Double-Gate FinDRAM", 2004 IEEE International Electron Devices Meeting Technical Digest, Dec. 2004, 4 pages.
T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.
International Search Report PCT/US2005/033439, mailed Jan. 31, 2006 (7 pgs.).
International Search Report PCT/US2005/035380, mailed Feb. 13, 2006 (14 pgs.).
International Search Report PCT/US2005/037169, mailed Feb. 23, 2006 (11 pgs.).
Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.
Yang-Kyu Choi, et al., "A Spacer Patterning Technology for Nanoscale CMOS" IEEE Transactions on Electron Devices, vol. 49, No. 3, Mar. 2002, pp. 436-441.
W. Xiong, et al., "Corner Effect in Multiple-Gate SOI MOSFETs" 2003 IEEE, pp. 111-113.
Weize Xiong, et al., "Improvement of FinFET Electrical Characteristics by Hydrogen Annealing" IEEE Electron Device Letters, vol. 25, No. 8, Aug. 2004, XP-001198998, pp. 541-543.
Fu-Liang Yang, et al., "5nm-Gate Nanowire FinFET" 2004 Symposium on VLSI Technology Digest of Technical Papers, 2004 IEEE, pp. 196-197.
B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.
R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).
Ludwig, T. et al., "FinFET Technology for Future Microprocessors" 2003 IEEE, pp. 33-34.
Stolk, Peter A. et al. "Modeling Statistical Dopant Fluctuations in MOS Transistors", 1998 IEEE, IEEE Transactions on Electron Devices, vol. 45, No. 9, Sep. 19987, pp. 1960-1971.
Seevinck, Evert et al., "Static-Noise Margin Analysis of MOS SRAM Cells" 1987 IEEE, IEEE Journals of Solid-State Circuits, vol. SC-22, No. 5, Oct. 1987.
Yang-Kyu Choi et al. "Sub-20nm CMOS FinFET Technologies", IEEE 2001, IEDM 01-421 to 01-424.
Ieong, M. et al. "Three Dimensional CMOS Devices and Integrated Circuits", IEEE 2003, CICC, San Jose, CA, Sep. 21-24, 2003, pp. 207-214.
Nowak, E. J. et al., "Scaling Beyond the 65nm Node with FinFET-DGCMOS", IEEE 2003, CICC, San Jose, CA, Sep. 21-24, 2003, pp. 339-342.
Jones, E.C., "Doping Challenges in Exploratory Devices for High Performance Logic", 14th International Conference, Piscataway, NJ, Sep. 22-27, 2002, pp. 1-6.
Park, T. et al. "PMOS Body-Tied FinFET (Omega MOSFET) Characteristics", Device Research Conference, Piscataway, NJ, Jun. 23-25, 2003, IEEE, pp. 33-34.
Nowak, E.J. et al., "A Functional FinFET-DGCMOS SRAM Cell", International Electron Devices Meeting 2002, San Francisco, CA, Dec. 8-11, 2002, pp. 411-414.
Chau, Robert S. et al., "Tri-gate Devices and Methods of Fabrication", U.S. Appl. No. 10/227,068, filed Aug. 23, 2002.
Chau, Robert S. et al., "Tri-gate Devices and Methods of Fabrication", U.S. Appl. No. 10/367,263, filed Feb. 14, 2003.
Park, Jae-Hyoun et al., "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.

Chang, L. et al. "CMOS Circuit Performance Enhancement by Surface Orientation Optimization" IEEE Transactions on Electron Deivces, IEEE Service Center, Piscataway, NJ vol. 51, No. 10, Oct. 2004, pp. 1621-1627 XP001211140.

Stadele, M. et al., "A Comprehensive Study of Corner Effects in Tri-gate Transistors", IEEE 2004, pp. 165-168.

"U.S. Appl. No. 10/227,068 Office Action", (Dec. 18, 2006), pp. 1-25.

"U.S. Appl. No. 10/703,316 Office Action", (Dec. 15, 2006), pp. 1-22.

"U.S. Appl. No. 11/158,661 Final Office Action", (Jan. 15, 2008), 25 pages.

"U.S. Appl. No. 11/234,014 Non-Final Office Action", mailed Jan. 23, 2008, 9 pgs.

"International Search Report & Written Opinion", PCT/US2006/037634, (May 31, 2007), 1-21.

"International Search Report & Written Opinion", PCT/US2005/000947, (May 3, 2005), 1-14.

"International Search Report & Written Opinion", PCT/US2006/025751, (Dec. 6, 2006), 1-14.

"International Search Report & Written Opinion", PCT/US2004/032442, (Jun. 16, 2005), 1-21.

"International Search Report and Written Opinion", PCT/US2005/020339, (Oct. 4, 2005), 1-12.

Buchanan, D. A., et al., "Fabrication of Midgap Metal Gates Compatible With Ultrathin Dielectrics", Applied Physics Letters 73.12, (Sep. 21, 1998) pp. 1676-1678.

Claflin, B., et al., "Interface Studies of Tungsten Nitride And Titanium Nitride Composite Metal Gate Electrodes With Thin Dielectric Layers", Journal of Vacuum Science and Technology A 16.3, (May/Jun. 1998), pp. 1757-1761.

Fried, David M., et al., "High-Performance P-Type Independent-Gate FinFETs", IEEE 25(4):, (2004), 199-201.

Fried, David M., et al., "Improved Independent Gate N-Type FinFET Fabrication and Characterization", IEEE 24(9):, 1-3.

Guo, Jing, et al., "Performance Projections for Ballistic Carbon Nanotube Field-Effect Transistors", Applied Physics Letters 80(17):, (Apr. 29, 2002), 3192-3194.

Huang, Xuejue, et al., "Sub 50 nm FinFET: PMOS", 1999 IEEE International Electron Device Meeting Technical Digest, (1999), pp. 67-70.

Hwang, Jeong-Mo, et al., "Novel Polysilicon/Tin Stacked-Gate Structure for Fully-Depleted SOI/CMOS", International Electronic Devices Meeting Technical Digest, (1992), pp. 345-348.

Javey, Ali, et al., "Ballistic Carbon Nanotube Field-Effect Transistors", Nature, vol. 424, (Aug. 3, 2003), 654-657.

Javey, Ali, et al., "High-k Dielectrics for Advanced Carbon-Nanotube Transistors and Logic Gates", www.nature.com/naturematerials.com, (2002), 1-8.

Kuo, Charles, et al., "A Capacitorless Double Gate DRAM Technology for Sub-100-nm Embedded and Stand-Alone Memory Applications", IEEE 50(12):, (2003), 2408-2416.

Kuo, Charles, et al., "A Capacitorless Double-Gate DRAM Cell Design for High Density Applications", IEEE, (2002), 843-846.

Martel, Richard, et al., "Carbon Nanotube Field Effect Transistors for Logic Applications", IEEE, 7.5.1-7.5.4.

Mayer, T. M., et al., "Chemical Vapor Deposition of Flouroalkylsilane Monolayer Films for Adhesion Control in Microelectromechanical Systems", J. Vac. Sci. Technol. B. 18(5):, (2000), 2433-2440.

Nackaerts, et al., "A 0.314um2 6T-SRAM Cell build with Tall Triple-Gate Devices for 45nm node applications using 0.75NA 193nm lithography", IDEM, (2004), 269-272.

Nowak, Edward J., et al., "Turning Silicon On Its Edge.", IEEE Circuits & Devices Magazine vol. 1, (Jan./Feb. 2004).

Ohsawa, Takashi, et al., "Memory Design Using a One-Transistor Gain Cell on SOI", IEEE 37(11):, (2002), 1510-1522.

Park, Donggun, et al., "3-dimensional nano-CMOS Transistors to Overcome Scaling Limits", IEEE 2004, ISBN 0-7803-8511-X, (2004), 35-40.

Sugizaki, T., et al., "Novel Multi-bit SONOS Type Flash Memory Using a High-k Charge Trapping Layer", VLSI Technology, 2003. Digest of Technical Papers. Symposium on Jun. 10-12, 2003., (2003), pp. 27-28.

Tanaka, T., et al., "Scalability Study on a Capacitorless IT-DRAM: From Single-gate PD-SOI to Double-gate FinDRAM", IEEE, (2004), 1-4.

Tokoro, Kenji, et al., "Anisotropic Etching Properties of Silicon in KOH and TMAH Solutions", International Symposium on Micromechatronics and Human Science, IEEE, (1998), pp. 65-70.

Wolf, Stanley, et al., "Wet Etching Silicon", Silicon Processing for the VLSI Era, vol. 1: Process Technology, Lattice Press, Sunset Beach, CA, (Sep. 1986), 3 pages.

* cited by examiner

NONPLANAR SEMICONDUCTOR DEVICE WITH PARTIALLY OR FULLY WRAPPED AROUND GATE ELECTRODE AND METHODS OF FABRICATION

BACKGROUND OF THE INVENTION

1. Field of the Invention

The present invention relates to the field of semiconductor integrated circuit manufacturing, and more particularly to a nonplanar fully depleted substrate transistor having a partially or fully wrapped around gate electrode and their methods of fabrication.

2. Discussion of Related Art

In order to increase device performance, silicon on insulator (SOI) transistors have been proposed for the fabrication of modern integrated circuits. FIG. 1 illustrates a standard fully depleted silicon on insulator (SOI) transistor 100. SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 formed on the gate dielectric 108. Source 112 and drain 114 regions are formed in the silicon body 106 along laterally opposite sides of gate electrode 110.

Fully depleted SOI have been proposed as a transistor structure to take advantage of ideal sub-threshold gradients for optimized on current/off current ratios. In order to achieve ideal subthreshold gradients with transistor 100, the thickness of the silicon body 106 must be about ⅓ the size of the gate length (Lg) of the transistor or $Tsi = Lg/3$. However, as gate lengths scale especially as they approach 30 nm, the need for ever decreasing silicon film thickness (Tsi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202.

Double gate (DG) device 200 essentially has two gates, one on either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where $Tsi = (2 \times Lg)/3$. The most manufacturable form of the double gate (DG) device 200, however, requires that the body 202 patterning be done with photolithography that is 0.7×smaller than that used to pattern the gate length (Lg) of the device. In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, silicon body 202 requires a silicon body etch which can produce a silicon body 202 with an aspect ratio (height to width) of about 5:1.

FIG. 3 illustrates a pillar of MOSFET 300. The pillar of MOSFET 300 includes a drain region 302 formed in a semiconductor substrate. A circular silicon pillar 303 is formed on the semiconductor substrate. A gate dielectric layer 306 and a gate electrode 304 are formed around the circular pillar. A source region 308 is formed on the top of the silicon pillar. Current flows between the source and drain regions in a direction perpendicular to the substrate. A problem with the pillar MOSFET 300 is that is formed with elaborate and unconventional processing techniques. Another problem with the pillar MOSFET is that the source and drain regions are processed separately resulting in different electrical properties for the regions.

DETAILED DESCRIPTION OF THE PRESENT INVENTION

The present invention is a novel nonplanar device structure which has a gate electrode which is fully wrapped around the channel region or gate electrode which is almost entirely wrapped around the channel region and their methods of fabrication. In following description numerous specific details are set forth in order to provide a thorough understanding of the present invention. In other instances, well known semiconductor processes and manufacturing techniques have not been described in particular detail in order to not unnecessarily obscure the present invention.

The present invention is a novel nonplanar transistor structure. In an embodiment of the present invention, the nonplanar transistor has a gate electrode which is fully wrapped around the channel region. In another embodiment of the present invention, the nonplanar transistor has a gate electrode which is partially or almost entirely wrapped around the channel region of the transistor. The advantage of a transistor having a gate electrode which is fully wrapped around the channel region or almost all around the channel region is that it is easier to deplete the channel region of the device and thereby relax the thickness (Tsi) and width (Wsi) dimensional constraints of the semiconductor body. Additionally, by completely or partially surrounding the channel of the device, the drive current of the device is enhanced by providing two additional corners in the device which increases carrier density.

Figure 1:
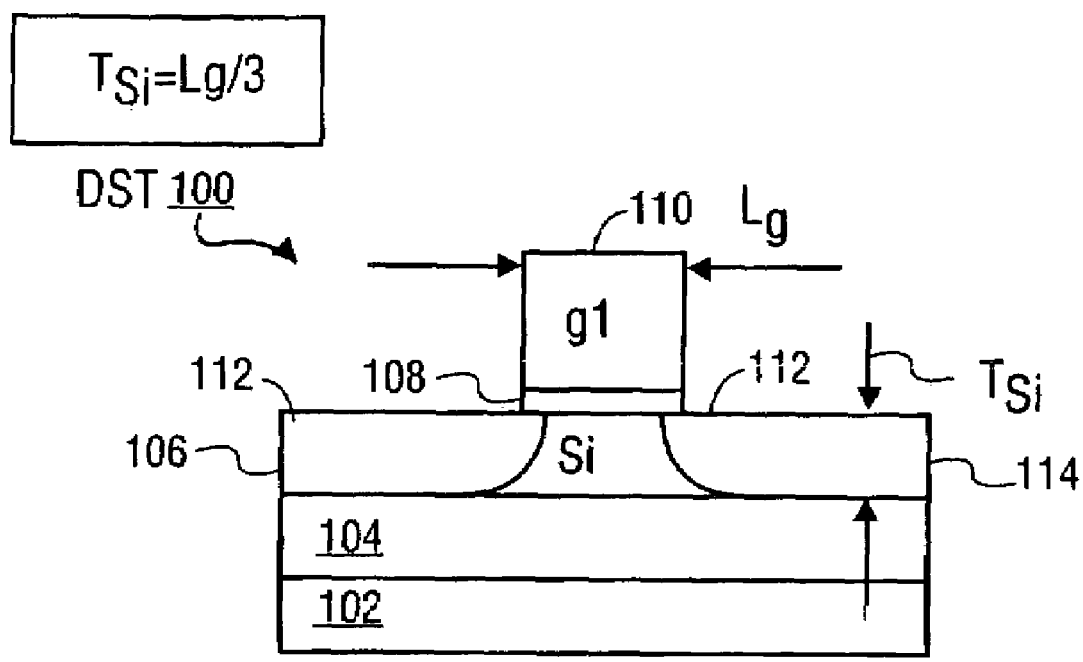
FIG. 1 is an illustration of a cross-sectional view of a depleted substrate transistor.
Figure 3:
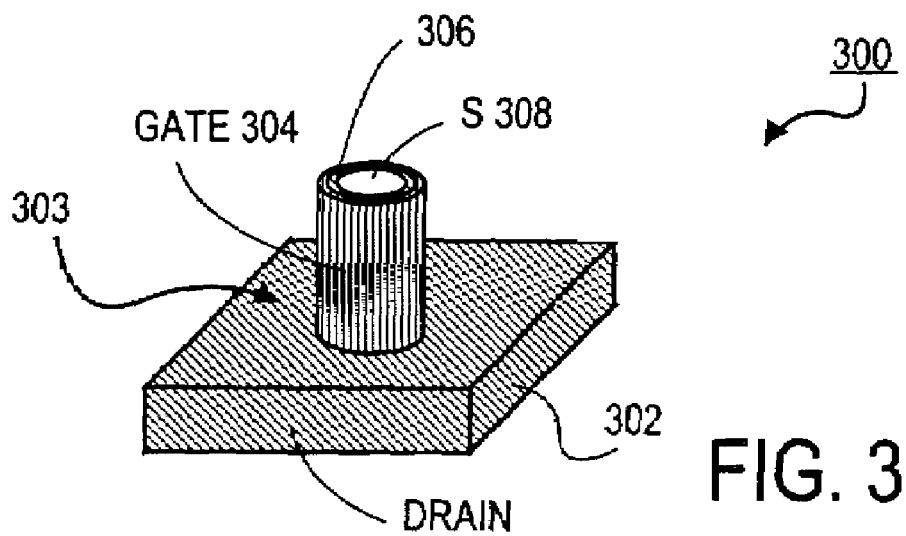
FIG. 3 is an illustration of a pillar MOSFET.
Figure 2A:
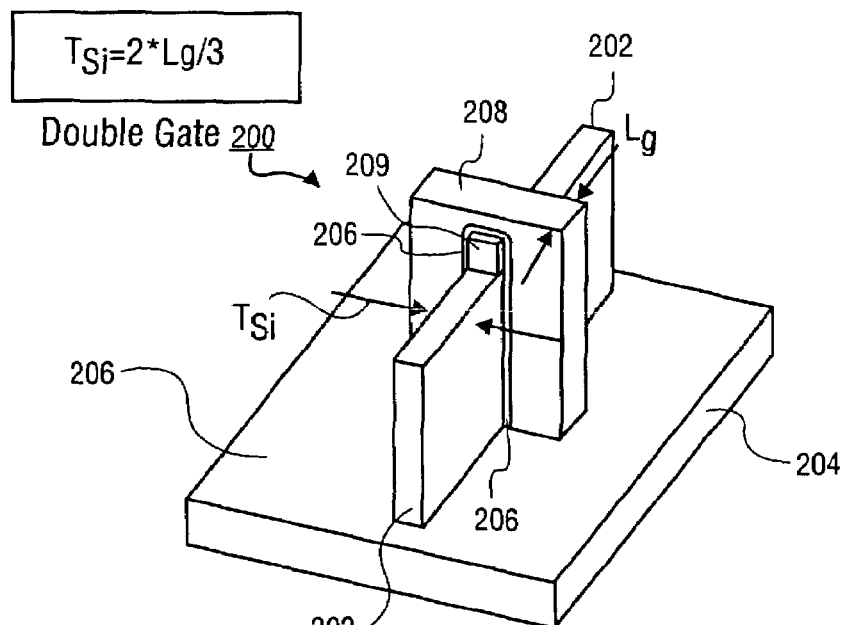
FIGS. 2A and FIG. 2B illustrate a double gate depleted substrate transistor.
Figure 2B:
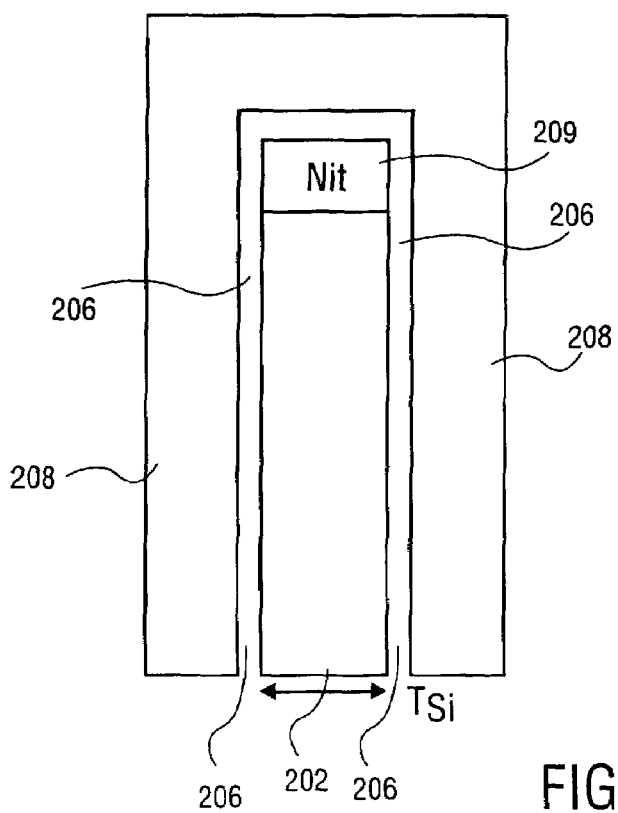
Figure 4A:
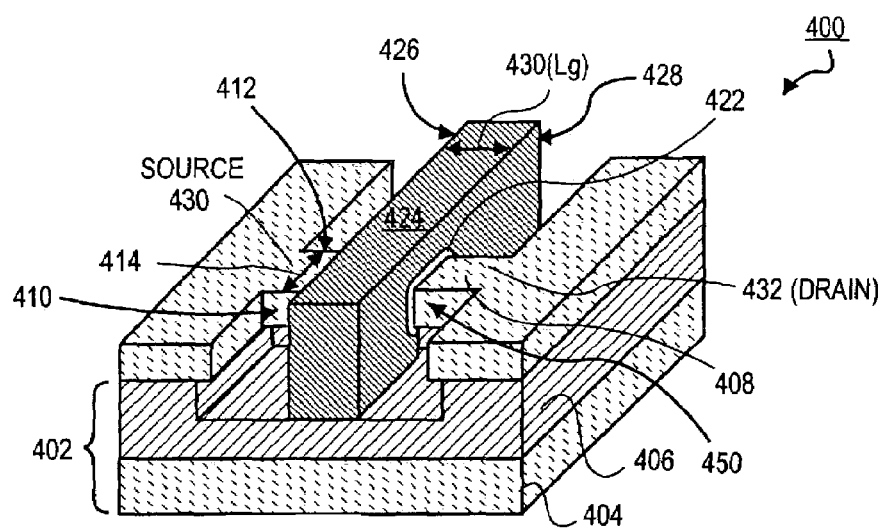
FIGS. 4A-4C illustrate a nonplanar transistor having a fully wrapped around or an almost wrapped around gate electrode.
Figures 4B, 4C:
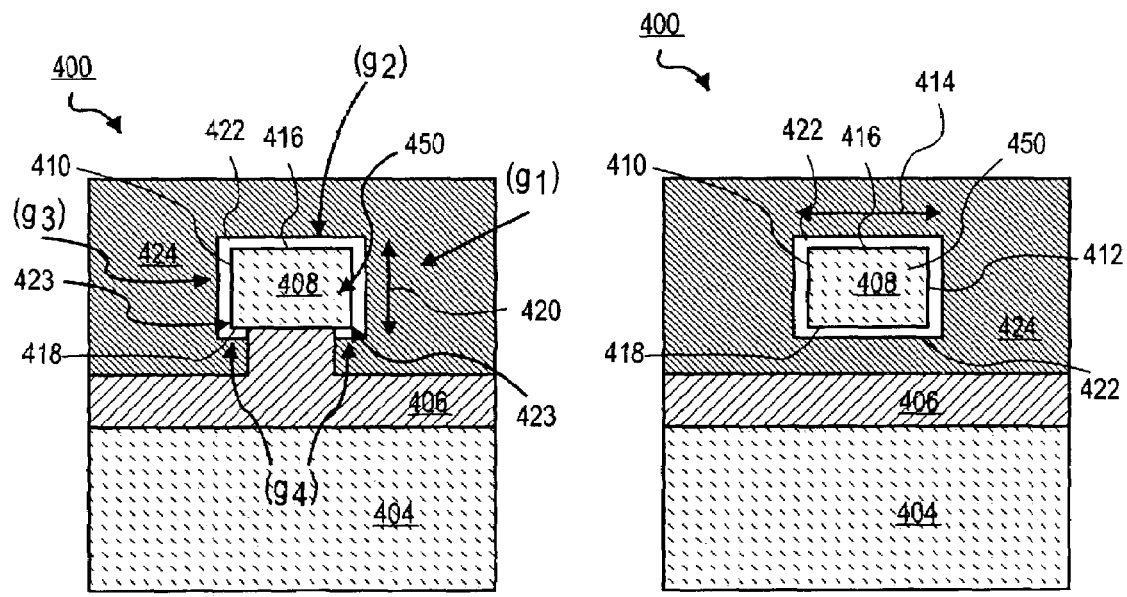

FIG. 4A is an overhead view of a nonplanar transistor 400 which has either a fully wrapped around gate electrode or a partially wrapped around gate electrode in accordance with embodiments of the present invention. FIG. 4B is a cross-sectional view of FIG. 4A taken through the gate electrode when the gate electrode is partially wrapped around the channel region of the device. FIG. 4C is a cross-sectional view of FIG. 4A taken through the gate electrode when the gate electrode is fully wrapped around the channel region of the device. The nonplanar device structure is ideal for use in a fully depleted substrate transistor application. The nonplanar device structure includes a thin semiconductor body 408 formed on an insulating substrate 402. A gate dielectric 422 is formed on the top surface, sidewalls and on at least a portion of the bottom surface of the semiconductor body. A gate electrode 424 is formed on the gate dielectric 422 on the top surface of the semiconductor body, is formed adjacent to the gate dielectric formed on the sidewalls of the semiconductor body and is formed beneath the gate dielectric formed on the bottom surface of the semiconductor body. Source and drain regions are formed in the semiconductor body 408 on opposite sides of the gate electrode 424. Because the gate electrode and gate dielectric surround the channel region of the semiconductor body 408 on three sides and on at least a portion of a fourth side, the semiconductor body can be easily fully depleted when the transistor is turned "ON" thereby enabling the formation of a fully depleted transistor with gate lengths less than 30 nanometers without requiring the use of ultrathin semiconductor bodies or requiring photolithographic patterning of the semiconductor bodies to dimensions less than the gate length (Lg) of the device. That is, the structure of the nonplanar transistor of the present invention enables a fully depleted transistor to be fabricated where the thickness of the semiconductor body and the width of the semiconductor body are equal to the gate length of the device. Because the novel nonplanar transistor of the present invention can be operated in a fully depleted manner, the device is characterized by ideal (i.e., very sharp) subthreshold slope (ideally 60 mV/decade at 25° C.) and a reduced drain induced barrier (DIBL) short channel effect of less than 100 mV/V and ideally about 60 mV/V which results in lower leakage current when the device is turned "OFF" resulting in lower power consumption.

Examples of a nonplanar transistor 400 in accordance with embodiments of present invention are illustrated in FIGS. 4A-4C. Nonplanar transistor 400 is formed on an insulating substrate 402. In an embodiment of the present invention, insulating substrate 402 includes a lower monocrystalline silicon substrate 404 upon which is formed in insulating layer 406, such as a silicon dioxide film. Nonplanar transistor 400, however, can be formed on any well-known insulating substrate such as substrates formed from silicon dioxide, nitrides, oxides, and sapphires.

Nonplanar transistor 400 includes a semiconductor body 408. Semiconductor body 408 provides the source region 430, drain region 432 and channel region 450 of the device. Semiconductor body 408 can be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. Semiconductor body 408 can be formed of any well-known material which can be reversibly altered from an insulating state to a conductive state by applying external electrical controls. Semiconductor body 408 is ideally a single crystalline film when the best electrical performance of transistor 400, is desired. For example, semiconductor body 408 is a single crystalline film when transistor 400 is used in high performance applications, such as in a high density circuit, such as a microprocessor. Semiconductor body 408, however, can be a polycrystalline film when transistor 400 is used in applications requiring less stringent performance, such as in liquid crystal displays. Insulator 406 insulates semiconductor body 408 from monocrystalline silicon substrate 402. In an embodiment of the present invention, semiconductor body 408 is formed from a single crystalline silicon film.

Semiconductor body 408 has a pair of laterally opposite sidewalls 410 and 412 separated by a distance which defines a semiconductor body width (Wsi) 414. Additionally, semiconductor body 408 has a top surface 416 opposite a bottom surface 418 formed on substrate 402. The distance between the top surface 416 and the bottom surface 418 defines a body height (Tsi) 420. In an embodiment of the present invention the body height 420 is substantially equal to the body width (Wsi) 414. In an embodiment of the present invention, the body 408 has a width 414 and height (Tsi) 420 less than 30 nanometers and ideally less than 20 nanometers. In an embodiment of the present invention, the body height 420 is between ½ the body width 414 to 2 times the body width 414.

Nonplanar device 400 has a gate dielectric layer 422. Gate dielectric layer 422 is formed on and around three sides of the channel region 350 of semiconductor body 408 as well as on or subadjacent to at least a portion of the bottom surface 418 of the channel region 450 semiconductor body 408 as shown in FIGS. 4A-4C. In the partially overlap embodiment of the present invention as shown in FIG. 4B, the gate dielectric layer 422 is formed on or adjacent to sidewall 412, on top surface 416, on or adjacent to sidewall 410 and is formed on a portion of the bottom surface 418 of semiconductor body 418 which extends from sidewall 412 towards the center of the bottom surface and covers a second portion which extends from sidewall 410 towards the center portion of the bottom surface 418. In the almost wrapped around embodiment shown in FIG. 4B, the gate dielectric layer 422 covers at least the lower corners 423 of the semiconductor body 408 and in another embodiment extends about ⅓ the width of semiconductor body 408 on each side. In the fully wrapped around embodiment shown in FIG. 4C, the gate dielectric layer 422 is formed on or adjacent to sidewall 412, on the top surface 416, on or adjacent to sidewall 410, and on the entire bottom surface 418 of the channel region of semiconductor body 408. Gate dielectric layer 422 can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 422 is a silicon oxynitride film formed to a thickness of between 5-20 Å. In an embodiment of the present invention, gate dielectric layer 422 isa high K gate dielectric layer, such as a metal oxide dielectric, such as but not limited to tantalum pentaoxide ($Ta_2O_5$), titanium oxide ($TiO_2$), hafnium oxide ($HfO_2$), $HfSiO_xN_y$, zirconium oxide ($ZrO_2$) and lanthanum oxide ($LaO_2$). Gate dielectric layer 422 can be other types of high K dielectric, such as but not limited to PZT.

Nonplanar device 400 has a gate electrode 424. Gate electrode 424 is formed on and around gate dielectric layer 422 as shown in FIGS. 4A-4C. In the partially overlapped embodiment of the present invention shown in FIG. 4B, the gate electrode 424 is formed on or adjacent the gate dielectric 424 formed on sidewall 412 of the channel region 450 of semiconductor body 408, is formed on gate dielectric layer 422 formed on the top surface 416 of the channel region of semiconductor body 408, is formed on or adjacent to gate dielectric layer 422 formed on sidewall 410 of the channel region of semiconductor body 408, and is formed beneath or directly subadjacent to gate dielectric layer 422 formed beneath bottom surface 418 of the channel region of semiconductor body 408. In an embodiment of the almost all around gate electrode transistor of the present invention, the gate electrode 424 extends beneath bottom surface 418 approximately ⅓ the width of semiconductor body 408 on each side of the channel region 450 of the semiconductor body. The goal is to have the gate electrode wrap around the corners 423 of the device enough to provide good corner control. In the almost all around embodiment the remaining portion of the bottom surface is formed on buried insulating layer 406. In the fully wrapped around embodiment shown in FIG. 4C, gate electrode 424 is formed on or adjacent to gate dielectric layer 422 formed on sidewall 412 of the channel region of semiconductor body 408, is formed on gate dielectric layer 422 formed on the top surface 416 of the channel region of semiconductor body 408, is formed adjacent to or on the gate dielectric layer 422 formed on sidewall 410 of the channel region of semiconductor body 408, and is formed beneath or directly subadjacent to the gate dielectric layer 422 formed on the channel region of semiconductor body 408. Gate electrode 424 has a pair of laterally opposite sidewalls 426 and 428 separated by a distance which defines the gate length (Lg) 430 of transistor 400. In an embodiment of the present invention the laterally opposite sidewalls 426 and 428 of the gate electrode 424 run in a direction perpendicular to the laterally opposite sidewalls 410 and 412 of semiconductor body 408.

Gate electrode 424 can be formed of any suitable gate electrode material. In an embodiment of the present invention to gate electrode 424 comprises of polycrystalline silicon doped to a concentration density between $1 \times 10^{19}$ atoms/cm$^3$ - $1 \times 10^{21}$ atoms/cm$^3$. In an embodiment of the present invention the gate electrode can be a metal gate electrode, such as but not limited to, tungsten, tantalum, titanium, and their nitrides. In an embodiment of the present invention the gate electrode is formed from a material having a work function compatible with the channel material (e.g., 4.0-5.2 eV for Si). It is to be appreciated, the gate electrode 424 need not necessarily be a single material and can be a composite stack of thin films, such as but not limited to a polycrystalline silicon/metal electrode or a metal/polycrystalline silicon electrode.

Nonplanar transistor 400 has a source region 430 and a drain region 432. Source region 430 and drain region 432 are formed in semiconductor body 408 on opposite sides of gate electrode 424 as shown in FIG. 4A. The source region 430 and the drain region 432 are formed of the same conductivity type such as N-type or P-type conductivity. In an embodiment of the present invention source region 430 and drain region 432 have a doping concentration of between $1 \times 10^{19}$ and $1 \times 10^{21}$ atoms/cm$^3$. Source region 430 and drain region 432 can be formed of uniform concentration or can include subregions of different concentrations or doping profiles such as tip regions (e.g., source/drain extensions). In an embodiment of the present invention when transistor 400 is a symmetrical transistor, source region 430 and drain region 432 have the same doping concentration and profile. In an embodiment of the present invention when nonplanar transistor 400 is formed as an asymmetric transistor, the doping concentration and profile of the source region 430 and the drain region 432 may vary in order to obtain a particular electrical characteristic. The source and drain regions may also include epitaxial silicon regrowth and/or silicides for improved device performance.

The portion of semiconductor body 408 located between source region 430 and drain region 432, defines the channel region 450 of transistor 400. The channel region 450 can also be defined as the area of the semiconductor body 408 surrounded by the gate electrode 424. At times however, the source/drain region may extend slightly beneath the gate electrode through, for example, diffusion to define a channel region slightly smaller than the gate electrode length (Lg). In an embodiment of the present invention channel region 450 is intrinsic or undoped monocrystalline silicon. In an embodiment of the present invention, channel region 450 is doped monocrystalline silicon. When channel region 450 is doped it is typically doped to a conductivity level of between $1 \times 10^{16}$ to $1 \times 10^{19}$ atoms/cm$^3$. In an embodiment of the present invention, when the channel region is doped it is typically doped to the opposite conductivity type of the source region 430 and the drain region 432. For example, when the source and drain regions are N-type conductivity the channel region 450 would be doped to p type conductivity. Similarly, when the source and drain regions are P type conductivity the channel region would be N-type conductivity. In this manner a nonplanar transistor 400 can be formed into either a NMOS transistor or a PMOS transistor respectively. Channel region 450 can be uniformly doped or can be doped non-uniformly or with differing concentrations to provide particular electrical and performance characteristics. For example, channel regions 450 can include well-known "halo" regions, if desired. When the transistor is turned "ON" current flows between the source region 430 and the drain region through the gated channel region 450 in a direction parallel to the plane of substrate 402.

By providing a gate dielectric and a gate electrode which surrounds the semiconductor body on all sides, the nonplanar transistor can be characterized as having four channels and four gates, one gate (g1) and channel which extends between the source and drain regions on side 412 of semiconductor body 408, a second gate (g2) and channel which extends between the source and drain regions on the top surface 416 of semiconductor body 408, a third gate (g3) and channel which extends between the source and drain regions on the sidewall 310 of semiconductor body 408 and a fourth channel and gate (g4) between the source and drain regions on the bottom surface 418 of semiconductor body 408. The gate "width" (Gw) of transistor 400 is the sum of the widths of the four gates. That is, the gate width of transistor 400 is equal to the height 420 of silicon body 408 at sidewall 410, plus the width of silicon body of 308 at the top surface 416, plus the height 420 of silicon body 408 at sidewall 412 plus the amount of the bottom surface of semiconductor body 408 above gate electrode 424. Larger "width" transistors can be obtained by using multiple devices coupled together (e.g., multiple silicon bodies 408 surrounded by a single gate electrode 424).

Figure 5:
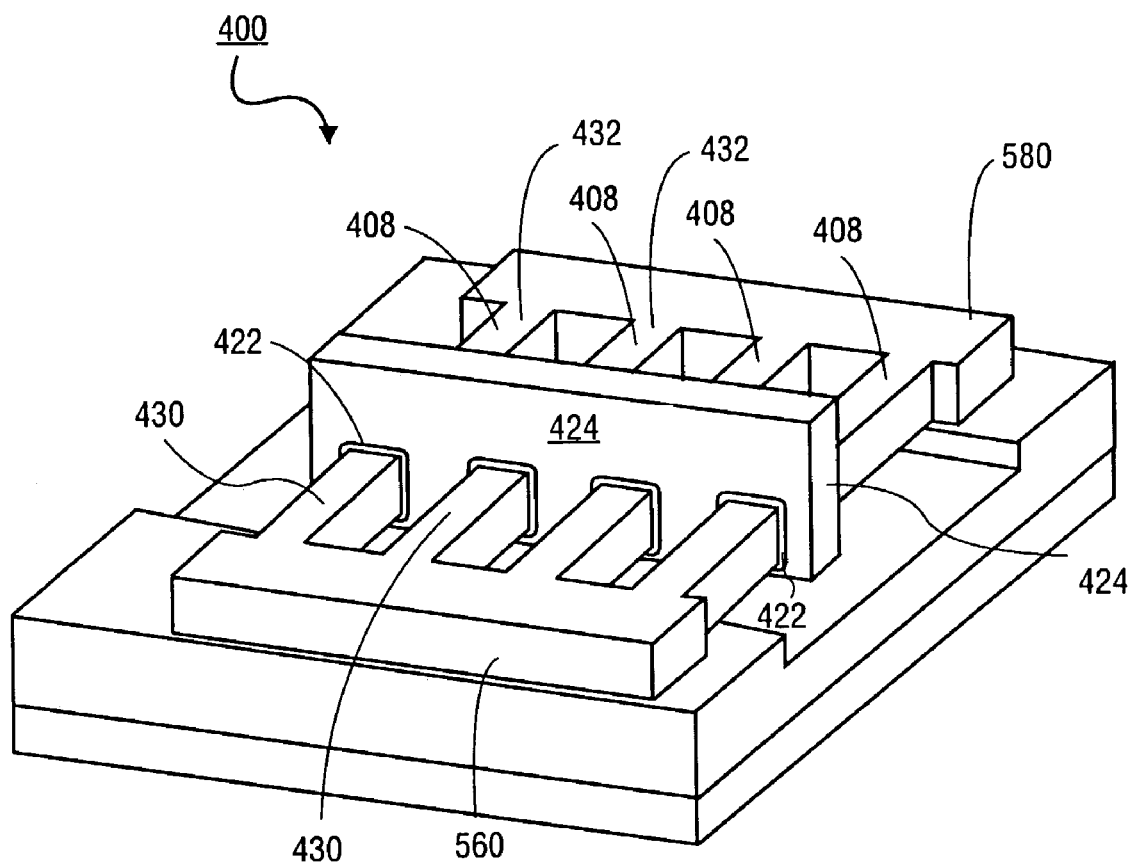
FIG. 5 is an illustration of a nonplanar transistor having multiple semiconductor bodies with a fully wrapped around or partially wrapped around gate electrode.

As stated above the gate "width" of transistor 400 is equal to the sum of the four gate widths created from semiconductor body 408 of transistor 400. In order to fabricate the transistors with larger gate widths, transistor 400 can include an additional or multiple semiconductor bodies or-fingers 408 as shown in FIG. 5. Each semiconductor body 408 has a gate dielectric layer 422 formed on its top surface and sidewalls and bottom surface or a portion of the bottom surface as shown in FIG. 5. Gate electrode 424 is formed on and adjacent to each gate dielectric 422 on each of the semiconductor bodies 408. Each semiconductor body 408 also includes a source region 430 and a drain region 432 formed in the semiconductor body 408 on opposite sides of gate electrode 424 as shown in FIG. 5. In an embodiment of the present invention each semiconductor body 408 is formed with the same width and height (thickness) as the other semiconductor bodies 408. In an embodiment of the present invention each source regions 430 and drain regions 432 of the semiconductor bodies 408 are electrically coupled together by source landing pad 560 and a drain landing pad 580 as shown in FIG. 5. Alternatively, the source regions 430 and drain regions 432 can be coupled together by higher levels of metalization (e.g., metal 1, metal 2, metal 3 . . . ) used to electrically interconnect various transistors 400 together into functional circuits. The gate width of transistor 400 as shown in FIG. 5 is equal to the sum of the gate width created by each of the semiconductor bodies 408. In this way, a tri-gate transistor 400 can be formed with any gate width desired.

Because the channel region 450 is surrounded on all sides by gate electrode 424 and gate dielectric 422, transistor 400 can be operated in a fully depleted manner wherein when transistor 400 is turned "ON" the channel region 450 fully depletes thereby providing the advantageous electrical characteristics and performance of a fully depleted transistor. That is, when transistor 400 is turned "ON" a depletion region is formed in channel region 450 along with an inversion layer at the surfaces of region 450 (i.e., an inversion layer is formed on the side surfaces 410 and 412 and on top surface 416 and on bottom surface 418 of the semiconductor body). The inversion layer has the same conductivity type as the source and drain regions and forms a conductive channel between the source and drain regions to allow current to flow therebetween. The depletion region depletes free carriers from beneath the inversion layers. The entire channel region 450 except for the inversion layer is depleted of carriers, thus the transistor can be said to be a "fully depleted" transistor. Fully depleted transistors have improved electrical performance characteristics over non-fully depleted or partially depleted transistors. For example, operating transistor 400 in a fully depleted manner, gives transistor 400 an ideal or very steep subthreshold slope. The nonplanar transistor can be fabricated with very steep sub-threshold slope of less than 80 mV/decade, and ideally about 60 mV/decade even when fabricated with semiconductor body thicknesses of less than 30 nm. Additionally, operating transistor 400 in the fully depleted manner, transistor 400 has an improved drain induced barrier (DIBL) lowering effect which provides for better "OFF" state leakage which results in lower leakage and thereby lower power consumption. In an embodiment of the present invention the tri-gate transistor 400 has a DIBL effect of less than 100 mV/V and ideally less than 40 mVN.

Figure 9:
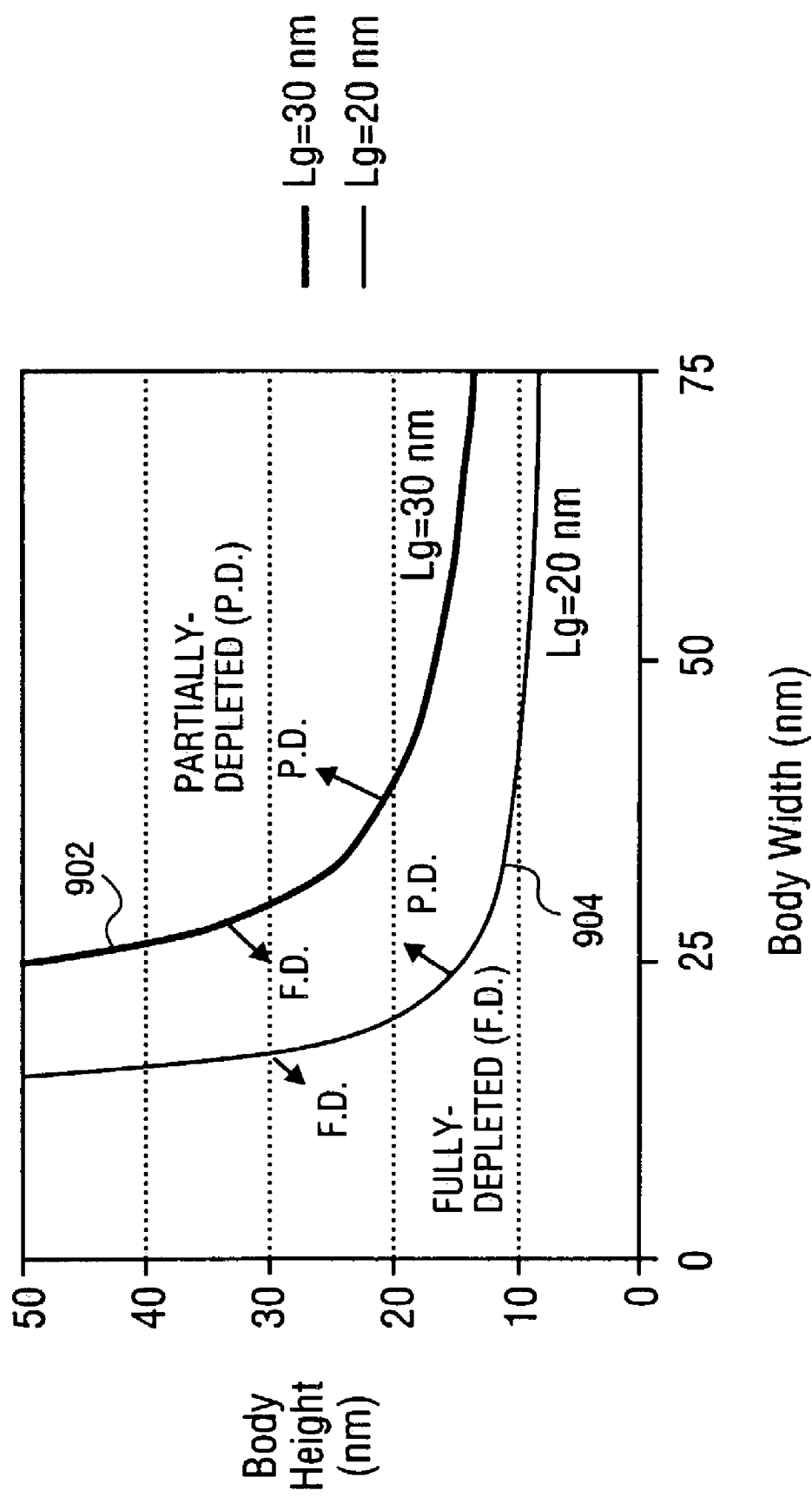
FIG. 9 is a plot which illustrates body heights and body widths which can be used to obtain partially depleted and fully depleted nonplanar transistors having gate lengths (Lg) of 30 nanometers and 30 nanometers.

FIG. 9 is an illustration of two plots 902 and 904 which set forth the body height and body width which will produce either fully depleted (F.D) or partially depleted (P.D) nonplanar transistors having gate length (Lg) of 30 nm (902) and 20 nm (904) respectively. In an embodiment of the present invention, the body height, body width and gate length are chosen to have dimensions in which a fully depleted transistor will be formed. In other embodiments, the nonplanar transistor has a body height, body width and gate length such that a partially depleted transistor is formed.

The nonplanar-transistor of the present invention can be said to be a nonplanar transistor because the inversion layers of the channel region 450 are formed in both the horizontal and vertical directions in semiconductor body 408. The semiconductor device of the present invention can also be considered a nonplanar device because the electric field from the gate electrode 424 is applied from both horizontal (g2 and g4) and vertical sides (g1 and g3).

Figure 6A:
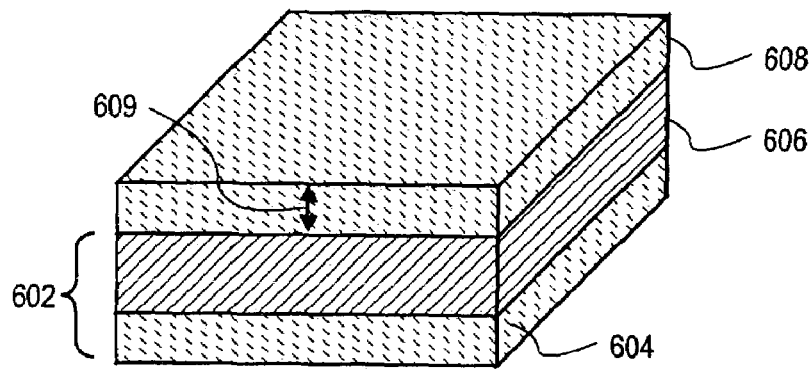
FIGS. 6A-6G illustrate a method of fabricating a nonplanar transistor with a fully wrapped around or almost wrapped around gate electrode utilizing a subtractive fabrication process.

A method of fabricating a nonplanar transistor with a partially or fully wrapped around gate electrode in accordance with embodiments of the present invention is illustrated in FIGS. 6A-6G. The method of FIGS. 6A-6G can be referred to as a subtractive fabrication process. The fabrication of a nonplanar transistor begins with an insulating substrate 602. A silicon or semiconductor film 608 is formed on insulating substrate 602 as shown in FIG. 6A. In an embodiment of the present invention, insulating substrate 602 includes a lower monocrystalline silicon substrate 604 and a top insulating layer 606, such as a silicon dioxide film or silicon nitride film. Insulating layer 606 isolates semiconductor film 608 from substrate 604, and in embodiment is formed to a thickness between 200-2000 Å. Insulating layer 606 is sometimes referred to as a "buried oxide" layer. When a silicon or semiconductor film 608 is formed on an insulating substrate 602, a silicon or semiconductor on insulating (SOI) substrate is created.

Although semiconductor film 608 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, as well as carbon nanotubes. In an embodiment of the present invention, semiconductor film 608 is an intrinsic (i.e., undoped) silicon film. In other embodiments, semiconductor film 608 is doped to a p type or n type conductivity with a concentration level between $1 \times 10^{16}$ $1 \times 10^{19}$ atoms/cm$^3$. Semiconductor film 608 can be insitu doped (i.e., doped while it is deposited) or doped after it is formed on substrate 602 by for example ion-implantation. Doping after formation enables both PMOS and NMOS nonplanar devices to be fabricated easily on the same insulating substrate. The doping level of the semiconductor body at this point determines the doping level of the channel region of the device.

Semiconductor film 608 is formed to a thickness which is approximately equal to the height desired for the subsequently formed semiconductor body or bodies of the fabricated nonplanar transistor. In an embodiment of the present invention, semiconductor film 608 has a thickness or height 609 of less than 30 nanometers and ideally less than 20 nanometers. In an embodiment of the present invention, semiconductor film 608 is formed to the thickness approximately equal to the gate "length" desired of the fabricated nonplanar transistor. In an embodiment of the present invention, semiconductor film 608 is formed thicker than desired gate length of the device. In an embodiment of the present invention, semiconductor film 680 is formed to a thickness which will enable the fabricated nonplanar transistor to be operated in a fully depleted manner for its designed gate length (Lg).

Semiconductor film 608 can be formed on insulating substrate 602 in any well-known method. In one method of forming a silicon on insulator substrate, known as the SIMOX technique, oxygen atoms are implanted at a high dose into a single crystalline silicon substrate and then anneal to form the buried oxide 606 within the substrate. The portion of the single crystalline silicon substrate above the buried oxide becomes the silicon film 608. Another technique currently used to form SOI substrates is an epitaxial silicon film transfer technique which is generally referred to as bonded SOI. In this technique a first silicon wafer has a thin oxide grown on its surface that will later serve as the buried oxide 606 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plain created by the hydrogen implant. This results in a SOI structure with a thin silicon layer on top, the buried oxide underneath all on top of the single crystalline silicon substrate. Well-known smoothing techniques,, such as HCI smoothing or chemical mechanical polishing (CMP) can be used to smooth the top surface of semiconductor film 608 to its desired thickness.

At this time, if desired, isolation regions (not shown) can be formed into SOI semiconductor film 608 in order to isolate the various transistors to be formed therein from one another. Isolation regions can be formed by etching away portions of the substrate film 608 surrounding a nonplanar transistor, by for example well-known photolithographic and etching techniques, and then back filling the etched regions with an insulating film, such as $SiO_2$.

Figure 6B:
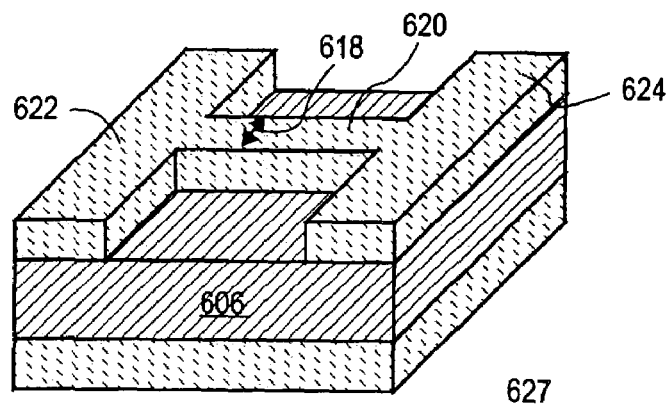

Next, standard photolithography and etching techniques are used to define a semiconductor body or fin 620 in the semiconductor film 608 for the tri-gate transistor as shown in FIG. 6B. In an embodiment of the present invention, the fin or body 620 is patterned to have a width 618 which is equal to or greater than the width desired of the gate length (Lg) of the fabricated transistor. In this way, the most stringent photolithography constraints used to fabricate the transistor are associated with the gate electrode patterning and not the semiconductor body or fin definition. In an embodiment of the present invention, the semiconductor body or fins will have a width 618 less than or equal to 30 nanometers and ideally less than or equal to 20 nanometers. In an embodiment of the present invention, the semiconductor bodies or fins have a width 618 approximately equal to the silicon body height 609. In an embodiment of the present invention, the fins or bodies 620 have a width 618 which is between ½ the semiconductor body height 609 and two times the semiconductor body height 609.

Additionally, the photolithography and etching step can be used to form multiple semiconductor bodies or fins, for a single transistor as shown in FIG. 5. In this way, transistors with different gate widths (Gw) can be fabricated across a wafer. The photolithography and etching step can also be used to form source landing pads 622 and drain landing pads 624 from the semiconductor film in order to provide contact areas for the transistor. Additionally, the landing pads can be used to connect together the various source regions and to connect together the various drain regions when multiple semiconductor bodies are used in the nonplanar transistor.

The semiconductor film 608 can be patterned into fins and landing pads by well known photolithography and etching techniques which generally include the formation of a photoresist mask by masking, exposing, and developing a blanket deposited photoresist film, and then etching semiconductor film in alignment with the photoresist mask to form one or more silicon bodies or fins 620 and source and drain landing pads 622 and 624 respectively. Semiconductor film 608 is etched until the underlying buried insulating layer 606 is exposed. Well-known semiconductor etching techniques, such as anisotropic plasma etching or reactive ion etching can be used to etch semiconductor film 608 in alignment with the photoresist mask. After semiconductor film 608 is etched to form a semiconductor body or fin 620 (and source/drain landing pads 622 and 624, if desired) the photoresist mask is removed by well-known techniques, such as by chemical stripping and $O_2$ashing, to produce the substrate shown in FIG. 6B.

Figure 6C:
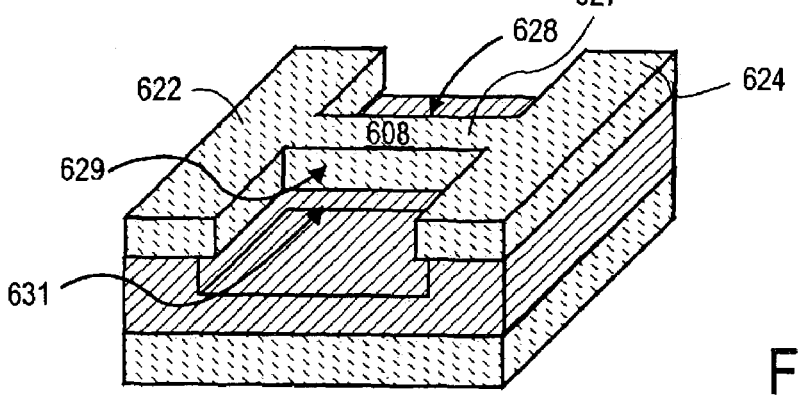

Next, as shown in FIG. 6C, a portion of the buried oxide layer 606 formed beneath semiconductor body 620 is removed. A short isotropic oxide etch can be performed to "undercut" the semiconductor body 620 and remove a portion or all of the buried oxide layer 606 beneath the semiconductor body 620. In the fabrication of an almost wrapped around gate electrode, the insulation etch (undercut etch) removes only a portion of the insulating film beneath the semiconductor body 620. In an embodiment of the present invention, the etch removes approximate ⅓ of the body width of the insulating film 606 from beneath each side of the semiconductor body 620. When forming a transistor with a fully wrapped around gate electrode, the entire portion of the buried insulating layer 606 is removed from beneath the semiconductor body 620. In such a case, the semiconductor body 620 can be supported by source and drain landing pads 622 and 624 formed on the remaining portions of the buried insulating layer. Any well known isotropic oxide etch may be utilized which is selective to the semiconductor material (i.e., an etch which can preferentially etch the insulating film 606 without significantly etching the semiconductor film 608). An etch with a selectivity of at least 10:1 is desired. When the semiconductor film 608 is silicon and the insulating film 606 is silicon oxide, a buffered oxide etch (BOE) comprising hydrogen fluoride (HF) can be utilized.

Next, a gate dielectric layer 626 is formed on and around each semiconductor body 620. That is, a gate dielectric layer 626 is formed on the top surface 627 of semiconductor body 620 as well as on the laterally opposite sidewalls 628 and 629 of each of the semiconductor bodies 620. When forming a partially wrapped around gate electrode, the gate dielectric 626 layer is formed on the exposed portion 631 of the underside of the semiconductor body 620. When forming a completely wrapped around gate electrode, the gate dielectric layer is formed on the entire bottom surface of the exposed semiconductor body. The gate dielectric can be a deposited dielectric or a grown dielectric. The gate dielectric layer 626 should be formed by a conformal process which enables the formation of the dielectric 626 on the underside of the semiconductor body 620. In an embodiment of the present invention, the gate dielectric layer 626 is a silicon dioxide dielectric film grown with a dry/wet oxidation process. In an embodiment of the present invention, the silicon oxide film is grown to a thickness of between 5-15 Å. In an embodiment of the present invention, the gate dielectric film 626 is a deposited dielectric, such as but not limited to a high dielectric constant film, such as metal oxide dielectric, such as tantalum pentaoxide ($Ta_2O_5$), titanium oxide ($TiO_2$), hafnium oxide ($HfO_2$), $HfSiO_xN_y$, zirconium oxide ($ZrO_2$) and lanthanum oxide ($LaO_2$) or other high-K dielectrics, such as PZT and BST formed by chemical vapor deposition (CVD) or atomic layer deposition (ALD).

Figure 6D:
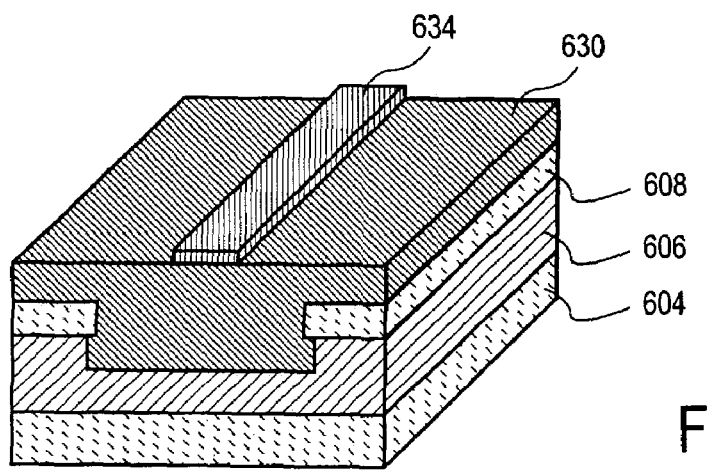

Next, as also shown in FIG. 6D, a gate electrode material 630 is blanket deposited over the substrate. The gate electrode 630 is formed on the gate dielectric layer 626 formed on the top surface 627 of semiconductor body 620 and is formed on or adjacent to the gate dielectric 626 formed on or adjacent to the sidewalls 628 and 629 of the semiconductor body 620 and is formed beneath or subadjacent to the gate dielectric on the bottom of body 620. The gate electrode material 630 is formed by a conformal process, such as CVD or ALD, in order to ensure that gate electrode material can fill beneath the undercut portion of the semiconductor body so that the gate electrode can partially or fully wrap around the semiconductor body 608. The gate electrode material 630 can be deposited to a thickness between 200-3000 Å. In an embodiment the gate electrode material is deposited to a thickness or height sufficient to form a gate electrode with a height of at least three times the height 609 of semiconductor bodies 620. In embodiment of the present invention, the gate electrode material comprises polycrystalline silicon. In another embodiment of the present invention, the gate electrode material comprises a polycrystalline silicon germanium alloy. In yet other embodiment of the present invention, the gate electrode material can comprise a metal film, such as tungsten, tantalum, and their nitrides.

Next, as shown in FIG. 6D, a hard mask material is deposited and defined into a patterned hard mask 632 which defines the location where the gate electrode is to be formed. The hard mask material can be formed of any material which will not be substantially etched while subsequently etching the gate electrode material into a gate electrode. In an embodiment of the present invention, the hard mask material is silicon nitride formed to a thickness between 20-100 nanometers. The hard mask material can be formed into a patterned hard mask 634 using standard photolithography and etching techniques. The patterned hard mask 634 is formed to a width which is desired for the electrode gate length of the device.

Figure 6E:
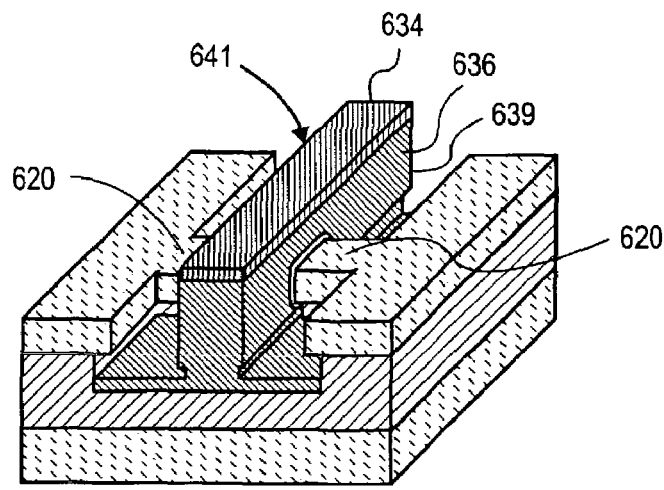
Figure 6F:
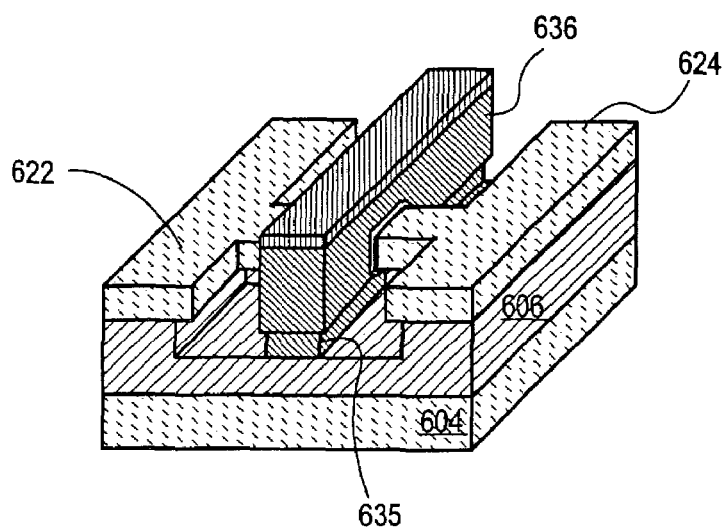

Next the gate electrode material is etched in alignment with the hard mask 634 to form a gate electrode 636. In an embodiment of the present invention, the gate electrode is first anisotropically etched in alignment with the hard mask to form a pair of laterally opposite sidewall 639 and 641 as shown in FIG. 6E. In an embodiment of the present invention, the anisotropic etch is continued until just about all of the unmasked gate electrode material 630 is removed and just before the buried insulating layer 606 is exposed. In an alternative embodiment of the present invention, the anisotropic etch is continued until all of the unmasked gate electrode material is removed and the buried insulating layer 606 exposed. In an embodiment of the present invention, the anisotropic etch is performed with an appropriate etch which forms a passivating polymer film on the sidewall 639 and 641 of the gate electrode to help insure that vertical sidewalls in alignment with the hard mask 634 are formed. Any suitable anisotropic etch technique and etchant which can anisotropically etch the gate electrode material without substantially etching the hard mask and semiconductor film 608 can be used. When the semiconductor film and gate electrode are formed from the same material, such as silicon, a hard mask such as silicon nitride can be used to pattern the semiconductor film into bodies and the hard mask left on during the gate patterning etch to protect the semiconductor body or bodies from etching during the gate etch. The distance between the laterally opposite sidewalls 639 and 641 defines the gate length (Lg) of the device. When the hard mask material is silicon nitride, and the gate electrode material is silicon or polysilicon, the gate electrode can be anisotropically etched and a passivating polymer film formed by a plasma etch utilizing a $HBr/Cl_2/O_2$ chemistry. Next, as shown in FIG. 6F, after the anisotropic etch, the etch is switched to an isotropic etch. The isotropic etch removes the gate electrode material from regions underneath the semiconductor body where the gate electrode is not to be formed. It is important to remove the undesired portions of the gate electrode material from under the semiconductor body 620 so that "stringers" are not left which can short the source and drain regions to the gate electrode. The isotropic etch which is utilized to remove the "stringers" can be performed after the anisotropic etch completely etches down to the underlying insulating layer or can be done after the anisotropic etch almost reaches the underlying insulating layer. A polymer sidewall passivation on the gate electrodes protects the gate electrode from laterally etching during the isotropic etch step. Some lateral undercutting 635 of the gate electrode 634 may result near the bottom of the gate electrode but the passivated top portion of the gate electrode should maintain its original profile. The degree of undercutting can be controlled by modifying the amount of insulating layer undercutting and the depth of the recess into the insulating layer. The gate electrode 634 is etched until the gate electrode is completely isolated from the semiconductor film 608 used to form the body 620 and source and drain region landing pads. In an embodiment of the present invention, the isotropic etch is conducted utilizing a hot phosphoric acid wet etch. In an embodiment of the present invention, the photolithography process used to define the hard mask and therefore the gate electrode 636 utilizes a minimum or smallest dimension lithography process used to fabricate the nonplanar transistor. (That is, in an embodiment of the present invention the gate length (Lg) of the gate electrode 636 has a minimum feature dimension of the transistor defined by photolithography). In an embodiment of the present invention, the gate length is less than or equal to 30 nanometers and ideally less than or equal to 20 nanometers.

Figure 6G:
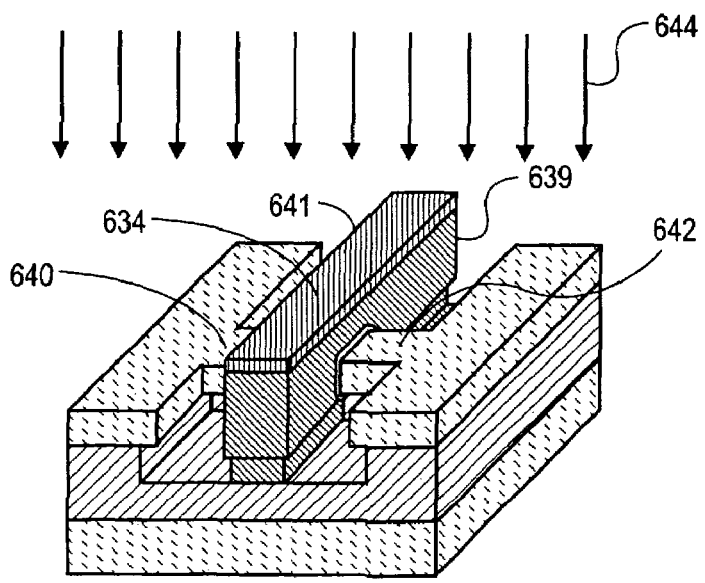

Next, source 640 and drain 642 regions for the transistor are formed in semiconductor body 620 on opposite sides of gate electrode 630 as shown in FIG. 6G. Source and drain regions 640 and 642, respectively, can be formed by placing dopants 644 into semiconductor bodies 620 on both sides 639, 641 of gate electrode 630 in order to form regions 640 and 642 as shown in FIG. 6G. If source and drain landing pads 622 and 624 are utilized, they are also doped at this time. For a PMOS tri-gate transistor, the semiconductor fin or body 620 on opposite sides of the gate electrode are doped to a p type conductivity and to a concentration between $1\times10^{20}$-$1\times10^{21}$ atoms/cm$^3$ to form the source and drain regions. For a NMOS tri-gate transistor, the semiconductor fin or body 620 on opposite sides of the gate electrode is doped with n type conductivity ions to a concentration between $1\times10^{20}$-$1\times10^{21}$ atoms/cm$^3$ to form source and drain regions. In an embodiment of the present invention, the body is doped by ion-implantation. In an embodiment of the present invention, the ion-implantation occurs in a vertical direction (i.e., a direction perpendicular to substrate 600).as shown in FIG. 6G. When gate electrode 630 is a polysilicon gate electrode, it can be doped during the ion-implantation process by first removing hard mask 634. A polysilicon gate electrode 630 will act as a mask to prevent the ion-implantation step from doping the channel region(s) 648 of the nonplanar transistor. The channel region 648 is the portion of the semiconductor body 620 located beneath or surrounded by the gate electrode 636. If gate electrode 636 is a metal electrode, the dielectric hard mask 634 can be used to block the doping during the ion-implantation process. In other embodiments, other methods, such as solid source diffusion, may be used to dope the semiconductor body to form source and drain extensions. At this point, fabrication of a nonplanar transistor with a partially or fully wrapped around gate electrode is complete.

In embodiments of the present invention, "halo" regions can be formed in silicon body prior to the formation of a source/drain regions or source/drain extension regions. Halo regions are doped regions formed in the channel region 648 of the device and are of the same conductivity but of a slightly higher concentration than the doping of the channel region of the device. Halo regions can be formed by ion-implanting dopants beneath the gate electrode by utilizing large angled ion-implantation techniques.

Additionally, if desired, the substrate shown in FIG. 6G can be further processed to form additional well known features, such as heavily doped source/drain contact regions, deposited silicon on the source and drain regions as well as the gate electrode, and the formation of silicide on the source/drain contact regions as well as on the gate electrode.

Figure 7A:
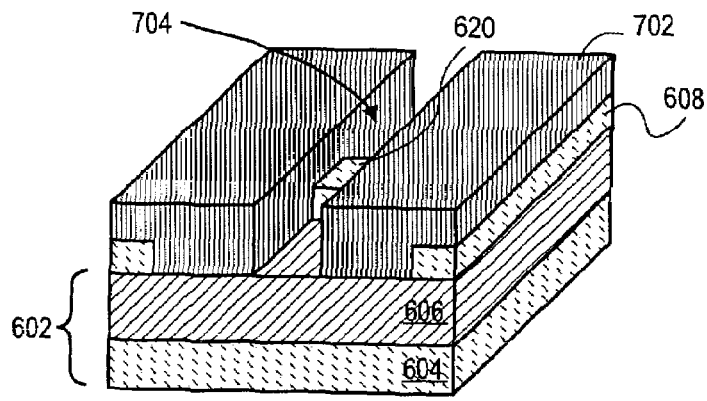
FIGS. 7A-7D illustrate a method of forming a nonplanar transistor with a fully wrapped around gate electrode or an almost wrapped around gate electrode utilizing a replacement gate fabrication process.

FIGS. 7A-7D illustrate a replacement gate method for forming a nonplanar transistor with an almost wrapper around or fully wrapped around gate electrode. The replacement gate technique is ideal for use when a metal gate electrode is desired. The replacement gate method begins with the same substrate and processing as shown in FIGS. 6A and 6B of the subtractive method described above. After patterning of the semiconductor film into a semiconductor body or fin 620 and the formation of source and drain landing pads, a dielectric film 702 is blanket deposited over the semiconductor body and landing pads and over exposed portions of the buried insulating layer 608. The insulating layer is formed to a thickness desired for the gate height. The insulating layer 702 can be any suitable insulating layer, such as silicon nitride or silicon dioxide. The dielectric film 702 is formed of a material which can be selectively etched with respect to the semiconductor film 608. Additionally, the dielectric film ideally can be selectively etched with respect to the underlying buried insulating layer 606. When the buried insulating layer is silicon dioxide and the semiconductor layer 608 is silicon, the insulating layer 702 can be silicon nitride. The blanket deposited insulating film 702 is then patterned with well known photolithography and etching techniques to form an opening or trench 704 in the dielectric film 702 which defines a location where the gate electrode is to be formed. The patterned insulating film 702 forms a definition mask for the formation of the gate electrode by a damascene patterning approach. The dielectric film 702 is etched with any suitable etchant which can anisotropically etch the dielectric film 702 without etching semiconductor body 620. The insulating layer 702 is etched until the underlying buried insulating layer 606 is exposed as well as the portion of the semiconductor body which is to provide the channel region of the device as shown in FIG. 7A. The opening 704 is formed with a width 706 desired of the gate length (Lg) of the nonplanar transistor.

Figure 7B:
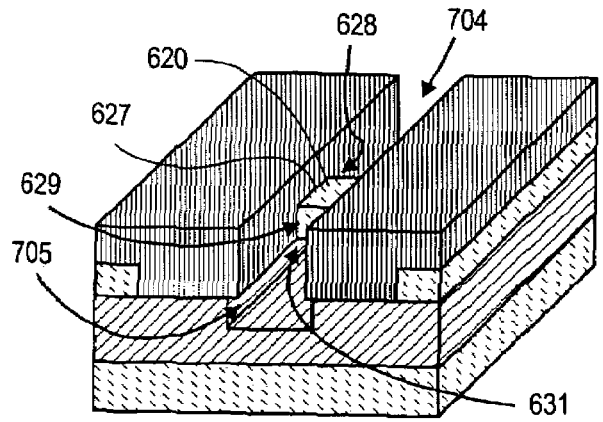

Next, the buried insulating layer 606 is etched away from underneath the semiconductor body 620 to form an opening 705 which undercut the active channel region of the semiconductor body 620 as shown in FIG. 7B. When forming a nonplanar transistor with an almost wrapped around gate electrode, the insulating layer undercut etch removes a portion of the insulating layer from underneath each side of the semiconductor body. In an embodiment of the present invention, the undercut etch undercuts the semiconductor body by an amount which enables the subsequently formed gate electrode to wrap around at least the lower corners of the semiconductor body 620 and thereby control the current flow in the corners. In an embodiment of the present invention, when forming a nonplanar transistor with an almost wrapped around gate electrode, the undercut etch removes approximately ⅓ of the insulating layer beneath each side 628 and 629 of the semiconductor body 620. When forming a nonplanar device with a fully wrapped around gate electrode, the buried insulating layer undercut etch is continued until the entire insulating layer beneath the exposed portion (i.e., channel region) of the semiconductor body 620 is completely removed. Any well known isotropic etch which can etch the buried insulating layer without significantly etching the semiconductor body may be used. When the buried insulating layer is silicon oxide and the semiconductor body is silicon, a wet etch comprising buffered HF may be utilized to form undercut opening 705. Additionally, as shown in FIG. 7B, the undercut etch will slightly undercut the patterned insulating layer 704 resulting in a slightly larger opening 705 and then trench 704.

Next, a gate dielectric layer 624 is formed on and around the exposed portion (i.e., channel region) of semiconductor body 620 as described above. That is, the gate dielectric layer is formed on the top surface of semiconductor body 620, is formed on the sidewalls 628 and 629 of semiconductor body 620 and is formed beneath or subadjacent to the exposed portions of the underside 631 of the semiconductor body. In the case of a fully wrapped around gate electrode, the gate dielectric layer 624 is formed on the entire underside 631 of the channel region or the semiconductor body. As described above, the gate dielectric layer may be any suitable material and should be formed with a conformal deposition process, such as atomic layer deposition (ALD) or chemical vapor deposition (CVD) to insure sufficient formation of a gate dielectric layer on the underside 631 of semiconductor body 620.

Next, a gate electrode material is blanket deposited over the substrate including on top of dielectric layer 702 and on top of and around the gate dielectric formed on and around semiconductor body 608 and onto insulating layer 608. The gate electrode material is deposited to a thickness sufficient to completely fill openings 705 and 706. The gate electrode material can be any suitable material used to form a gate electrode such as described above. In an embodiment of the present invention, the gate electrode material is a metal film, such as but not limited to tungsten (W), titanium nitride (TiN) and cobalt silicide ($CoSi_2$). The gate electrode material should be formed by a deposition technique, such as chemical vapor deposition (CVD) or atomic layer deposition (ALD) so that a conformal film is formed so that the entire trench opening 706 is filled as well as the undercut regions 705 beneath the semiconductor body 620 and the dielectric mask 702.

Figure 7C:
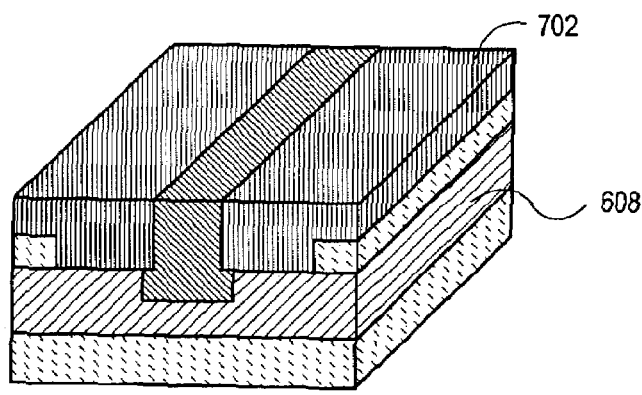

Next, a planarization technique is utilized to remove excess gate material from the top of dielectric layer 702 so that a planarized top surface may be formed as shown in FIG. 7C. Any well known and suitable planarization techniques, such as chemical mechanical polishing or plasma etch back may be utilized to remove the excess gate material from the top of the dielectric film 702.

Figure 7D:
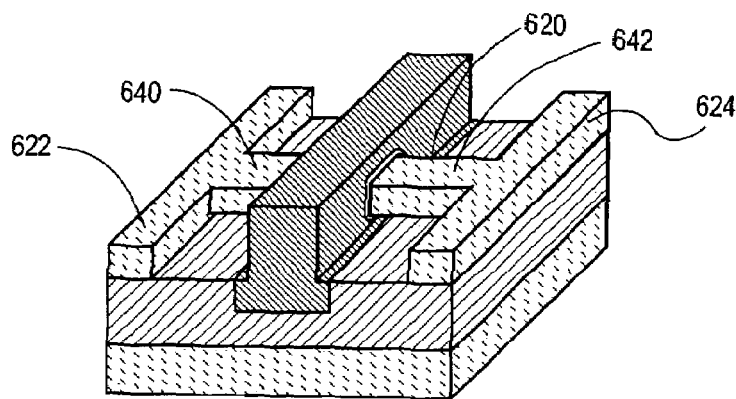

Next, as shown in FIG. 7D, the dielectric film 702 is removed. At this time, source and drain regions may be formed by doping portions of the semiconductor body 620 as described above. This completes the fabrication of a nonplanar device having a partially or fully wrapped around gate electrode utilizing a replacement gate process. If desired, well known additional features, such as sidewall spacers, heavily source/drain contact regions, and silicide may be added at this time.

FIGS. 8A-8G describe a method of forming a nonplanar device having a wrap around or fully wrapped around gate electrode whereby a replacement gate process is used after the formation of additional features, such as tip regions, spacer, additional semiconductors for ray source/drain regions and silicide on the source/drain regions.

Figure 8A:
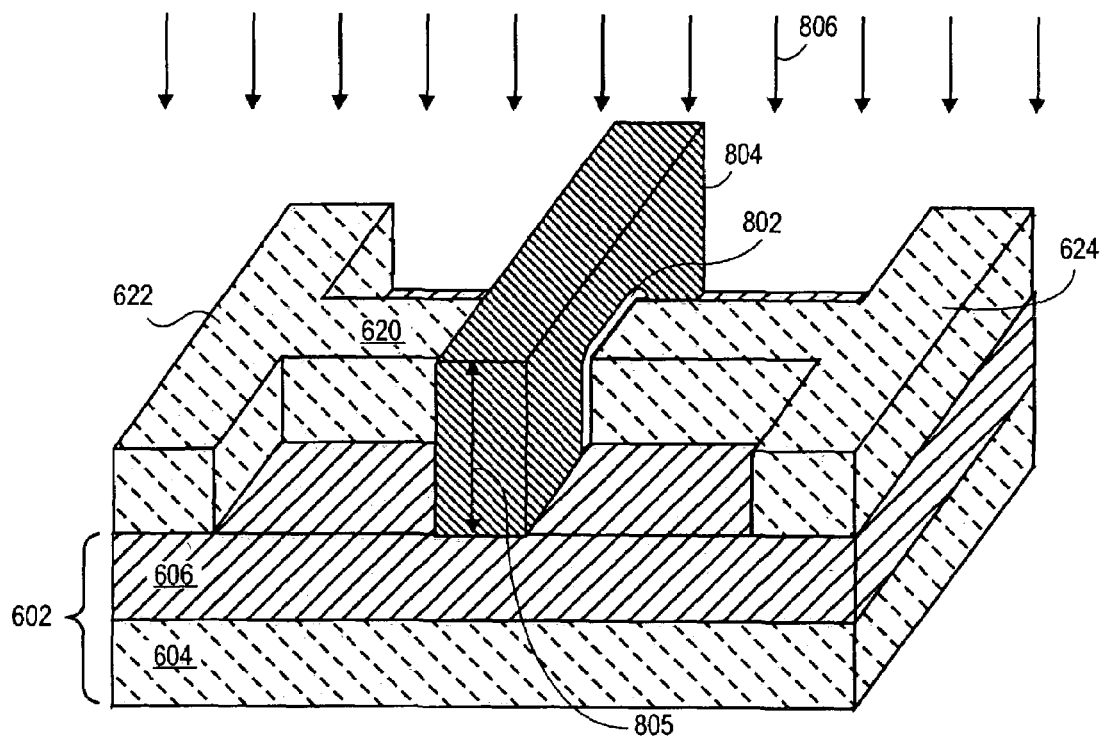
FIGS. 8A-8G illustrate method of forming a nonplanar transistor with a fully wrapped around gate electrode or an almost wrapped around gate electrode utilizing a replacement gate fabrication process.

The process begins with the same substrate and processing as shown in FIG. 6A and 6B. After the patterning of the semiconductor film 608 to form semiconductor body 620 or bodies 620 and source/drain landing pads 622 and 624, sacrificial gate oxide layer 802 and a sacrificial gate electrode 804 are formed over the top surface and sidewalls of the silicon body 620 as shown in FIG. 8A. In order to form the sacrificial gate dielectric and electrode, first a sacrificial gate dielectric layer material is blanket deposited over the substrate including the exposed surfaces of insulating layer 606, the top surfaces and sidewalls of semiconductor body 620 and semiconductor landing pads 622 and 624. Next, a sacrificial gate electrode material is blanket deposited over a substrate gate dielectric layer. The sacrificial gate electrode material is deposited to a thickness desired for the height 805 of the subsequently formed gate electrode for the nonplanar device. The sacrificial gate electrode material and the sacrificial gate dielectric material are then patterned by well known techniques, such as with photolithography and etching, to form the sacrificial gate electrode 804 and sacrificial gate dielectric 802 as shown in FIG. 8A. The sacrificial gate electrode and the sacrificial gate dielectric are patterned into the same shape and at the same location where the subsequently formed gate electrode and gate dielectric are to be formed. In an embodiment of the present invention, the sacrificial gate electrode material is formed from a material, such as silicon nitride or polysilicon.

Next, if desired, tip or, source/drain extensions can be formed, by doping the semiconductor body 620 on opposite sides of the sacrificial gate electrode 804 with impurities of the same conductivity type to be used to form a source/drain regions. The tip regions can be formed by any well known technique, such as by ion implantation, which implants dopants 806 into the semiconductor body 620 as shown in FIG. 8A. The sacrificial gate 804 prevents the channel region of the semiconductor body 620 from being doped during the tip formation step. In an embodiment of the present invention, tip regions having a doping concentration between $1 \times 10^{19}$-$1 \times 10^{21}$ atoms/cm$^3$ are formed.

Figure 8B:
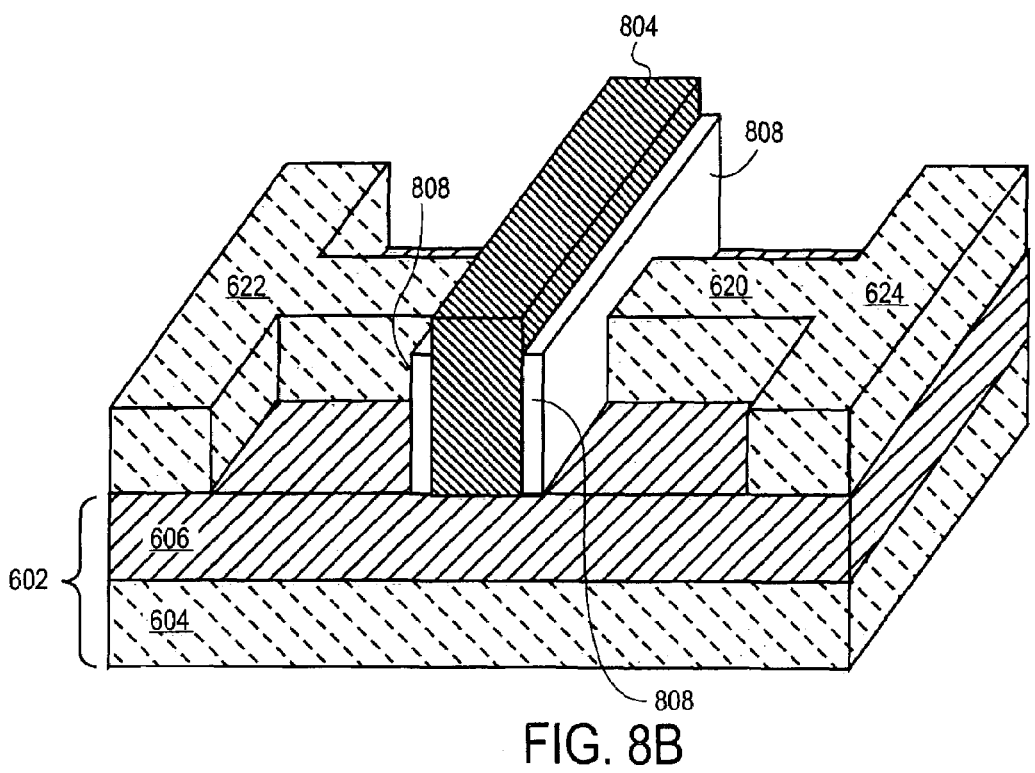

Next, if desired, dielectric sidewall spacers 808 can be formed along opposite sidewalls of the sacrificial gate electrode 804 as shown in FIG. 8B. Sidewall spacers can be formed by any well known technique, such as by blanket depositing a conformal sidewall spacer dielectric over the substrate including the top surface and sidewalls of the sacrificial gate electrode 804 as well as over the top surface and sidewalls of a semiconductor body 620 and landing pads 622 and 624 as well as onto the exposed surface of insulating substrate 602. The dielectric spacer material is deposited to a thickness which is approximately equal to the width desired for the spacers 808. In an embodiment of the present invention, the dielectric spacer material is deposited to a thickness between 20-100 nanometers. The spacer material can be silicon nitride, silicon oxide, silicon oxynitride or a combination thereof. The dielectric spacer material is then anisotropically etched back to remove the dielectric spacer material from all horizontal surfaces (e.g., top surface of the sacrificial gate electrode 804 and the top surface of semiconductor body 620 and insulating layer 606) while leaving spacer material on vertical surfaces (e.g., the sidewalls of sacrificial gate electrode 804) to form sidewall spacers 808 as shown in FIG. 8B. By making the height 805 of a sacrificial gate electrode 804 sufficiently taller (e.g., 3×) than the thickness or height of the semiconductor body 620, an "over etch" of the anisotropic etch back can be used to remove the spacer material from the sidewalls of the semiconductor body 620 and landing pads 622 and 622 while leaving sufficient spacer material to provide spacers 808 on the sidewalls of the sacrificial gate electrode 804.

Figure 8C:
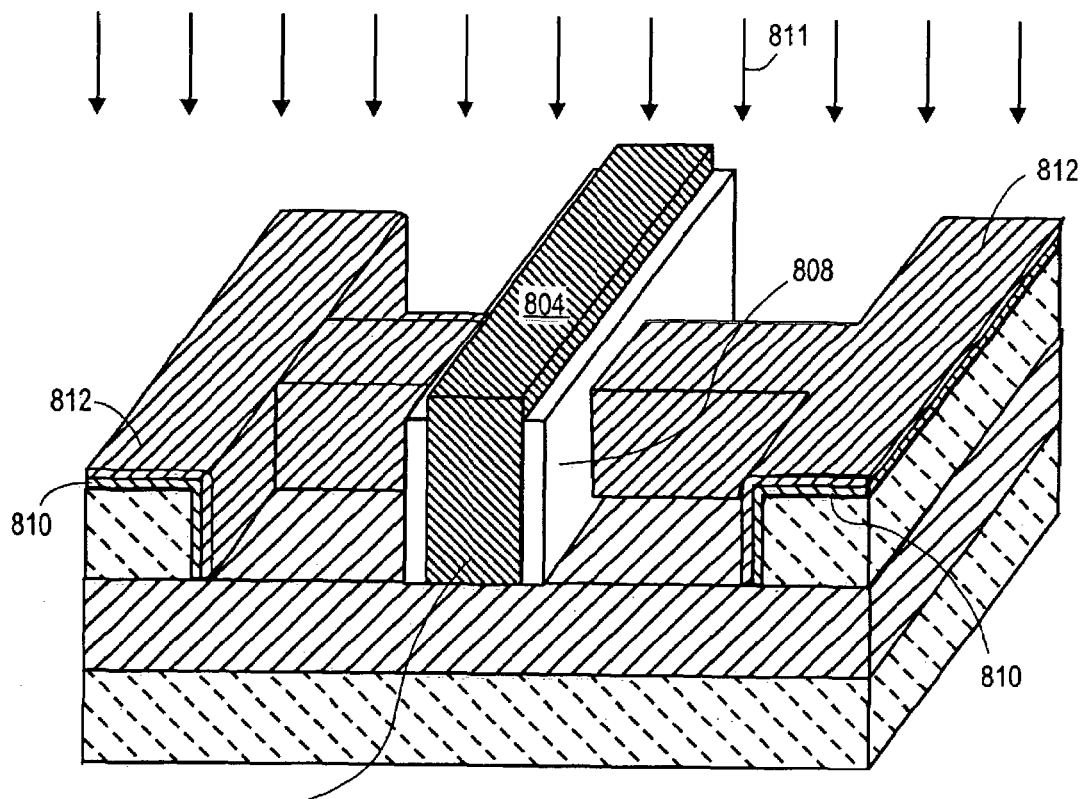

Next, as shown in FIG. 8C, additional silicon 810 and/or silicide 812 can be formed onto the exposed top surface and sidewalls of the semiconductor body 620 and landing pads 622 and 624. Additional silicon can be formed on the exposed surface of the semiconductor body 620 by utilizing a selective deposition process. A selective silicon deposition process deposits silicon, such as epitaxial silicon, onto silicon containing regions, such as semiconductor body 620 and landing pads 622 and 624 and does not deposit silicon on non-silicon containing areas, such as sacrificial gate electrode 804, dielectric spacers 808 and insulating layer 606. Any well known selective deposition process maybe used to provide the additional epitaxial silicon. In an embodiment of the present invention, between 50-500 Å of additional epitaxial silicon is selectively deposited onto semiconductor body 620 and landing pads 622 and 624 to form raised source/drain regions, Next, if desired, heavy source/drain regions maybe formed in the semiconductor body (and additional silicon, if used) on opposites of the gate electrode as well as into the landing pads 622 and 624. Sidewall spacers 808 prevent the underlying previously formed tip regions and the semiconductor body 620 from being doped by the heavy source/drain implant 810. Additionally, as before, the sacrificial gate electrode 804 masks the channel region from being doped during the heavy source/drain formation step.

Additionally, if desired, silicide 812, such as but not limited to cobalt silicide, nickel silicide, and titanium silicide may be formed onto the exposed surfaces of the semiconductor body or onto-the additionally added silicon film as shown in FIG. 8C. Silicide can be formed onto the top surface and side surfaces of the exposed semiconductor body or additional silicon by utilizing a self-aligned or "salicide" process. In a self-aligned or "salicide" process, a refractory metal film, such as but not limited to titanium, nickel and cobalt can be blanket deposited over the substrate including the silicon regions and dielectric regions. The substrate is then annealed to a temperature sufficient to cause the blanket deposited metal layer to react with the silicon containing regions to form a silicide. Regions, such as sidewalls spacers 808, as well as insulating layer 606 will not react with the metal and the metal will remain unreacted metal in these areas. Next, a selective wet etch can be used to remove the unreacted metal while leaving the metal silicide 812. In this way, silicide can be selectively formed only onto the silicon or semiconductor regions of a substrate as shown in FIG. 8C.

Figure 8D:
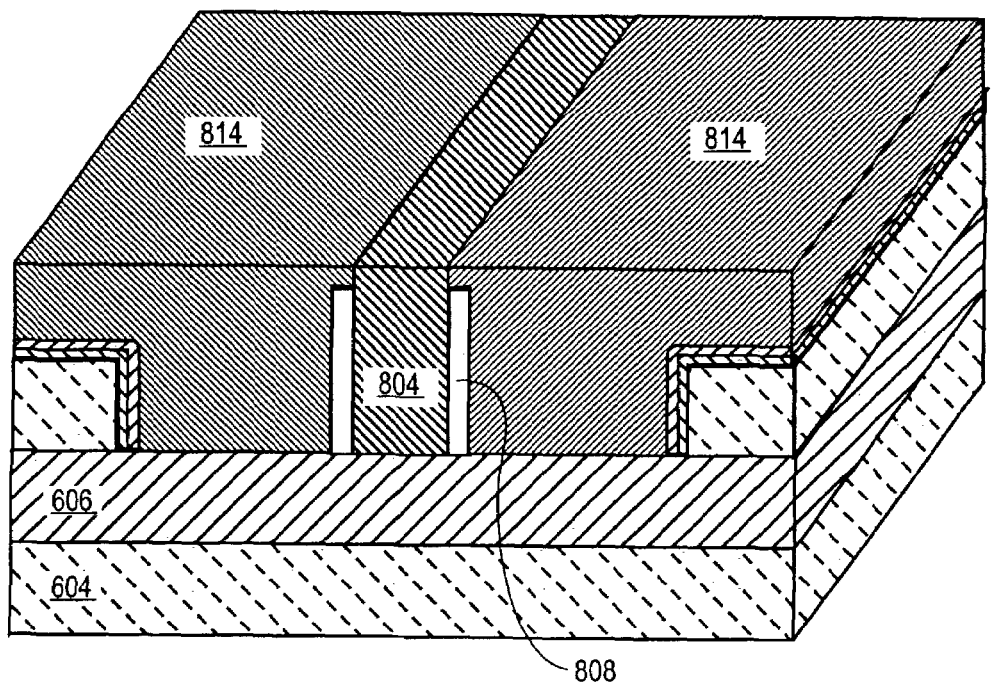

Next, as shown in FIG. 8D, a dielectric layer 814 is blanket deposited over the substrate. The dielectric layer is formed to a thickness sufficient to completely cover the substrate including sacrificial gate electrode 804. The dielectric layer 814 is formed of a material which can be selectively etched with respect to the sacrificial gate material as well as semiconductor body 620. That is, the dielectric material is formed of a material whereby the sacrificial gate electrode 804 can be removed without significantly etching away the dielectric layer 814. After blanket depositing the dielectric, the dielectric layer is planarized, such as chemical mechanical planarization until the top surface of the dielectric film is planar with the sacrificial gate electrode and the top surface of the sacrificial gate electrode exposed as shown in FIG. 8D.

Figure 8E:
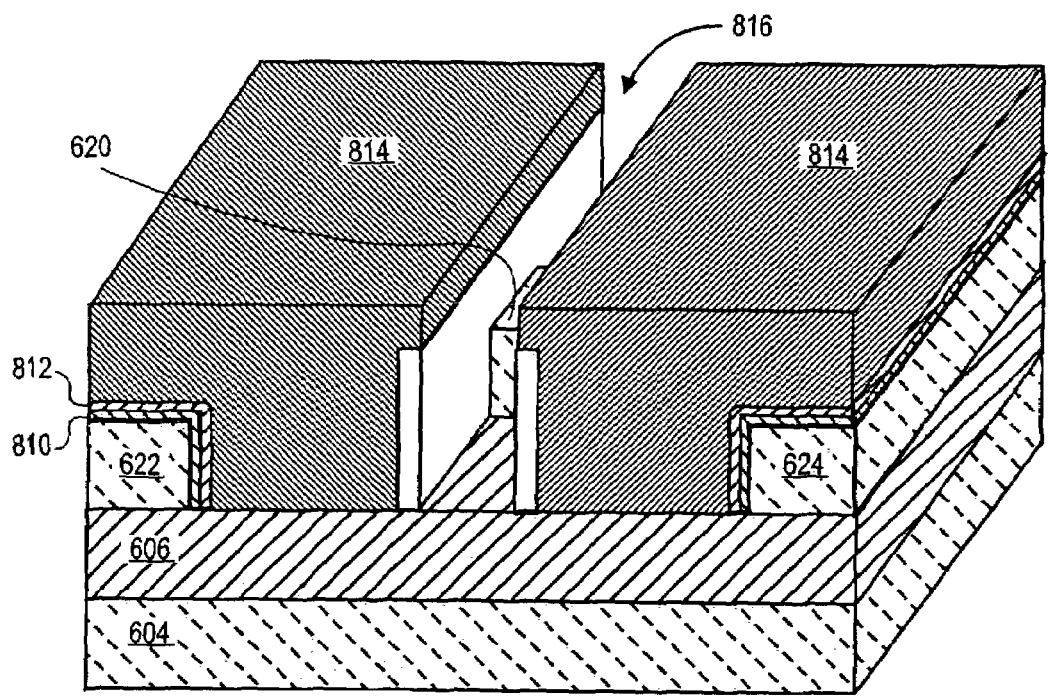

Next, as shown in FIG. 8E, the sacrificial gate 804 and gate dielectric 802 are etched out to form an opening 816 where the gate electrode is to be formed. Removing the sacrificial gate 808 and the sacrificial gate dielectric layer 802 exposes the channel region of the semiconductor body 620 of the nonplanar device as shown in FIG. 8E. Removal of the sacrificial gate electrode forms an opening 816 where the gate electrode is to be formed.

Figure 8F:
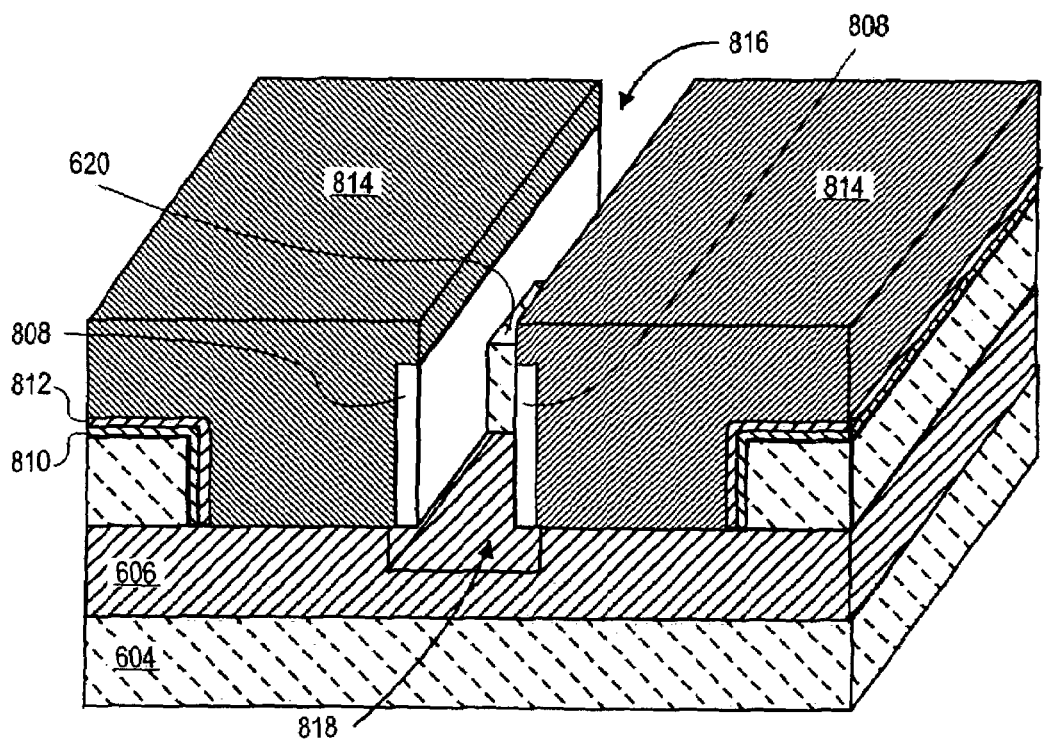

Next, as shown in FIG. 8F, the substrate is exposed to a undercut etch to form undercut opening 818 as described above. The undercut etch removes a portion of the insulating layer 606 from beneath the channel region of semiconductor body 620 as shown in FIG. 8F. The undercut etch can be used completely remove the insulating layer 606 from beneath the channel of semiconductor body 620 to expose the entire underside of the channel region of semiconductor body 620 in order to form a fully wrapped around gate electrode. Alternatively, the undercut etch may remove only a portion of the insulating layer 606 from beneath each side of the channel region of semiconductor body 620 so that a partially wrapped around gate electrode can be fabricated as described above.

Figure 8G:
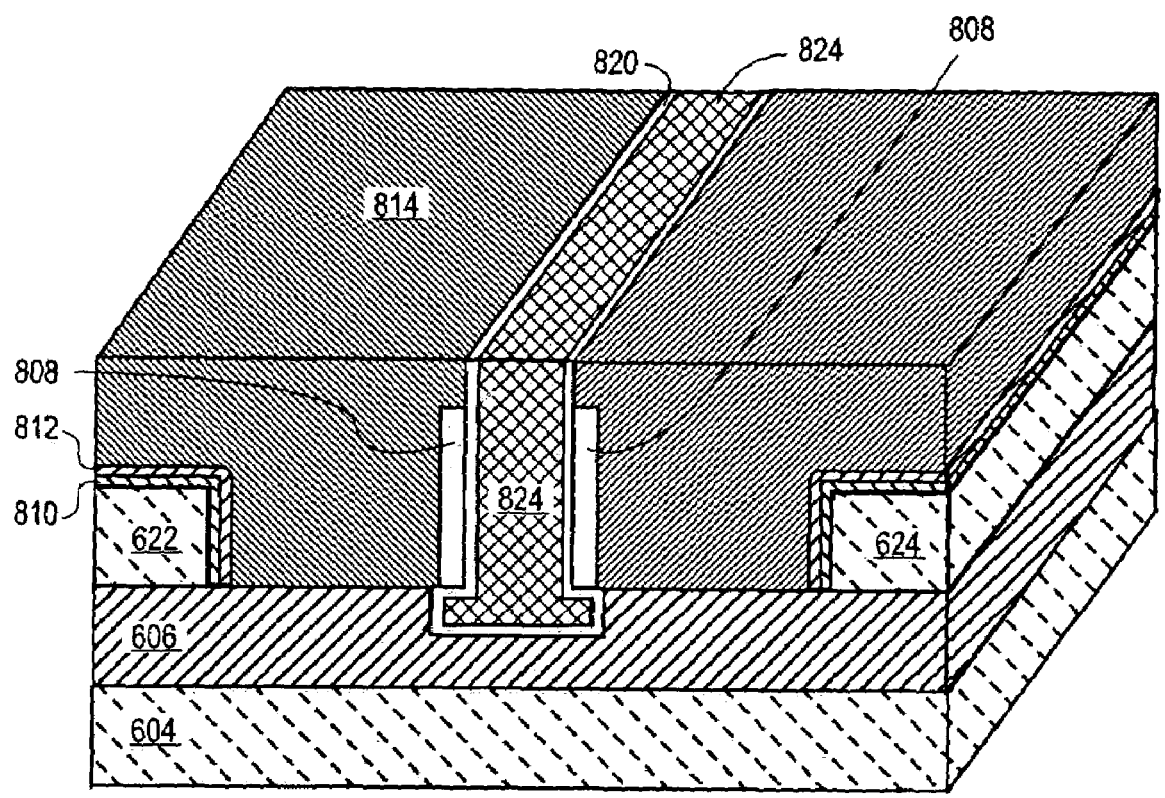

Next, as gate dielectric 820 and a gate electrode 824 are formed in openings 816 and 818 as shown in FIG. 8G. First, a gate dielectric film 820 is blanket deposited over the substrate. The gate dielectric material covers the top surface and sidewalls of the channel region of the semiconductor body 620 as well as the exposed lower surfaces of the semiconductor body 620 as described above. The gate dielectric material is formed by a conformal process, such as CVD or ALD, in order to ensure the formation of the gate dielectric material on the exposed underside of the channel region of the semiconductor body 620. Next, a gate electrode material is blanket deposited over the gate dielectric. The gate electrode material may be any well known gate electrode material, such as described above. The gate electrode material and gate dielectric are then chemically mechanically planarized until the top surface of the dielectric layer 814 is revealed as shown in FIG. 8G. Once the gate electrode material and the gate dielectric material are polished back or removed from the top dielectric material 814, a gate electrode 824 and gate dielectric layer 820 have been formed. The gate dielectric and gate electrode either partially or fully wraps around the channel region of the semiconductor body 620 as described above. Dielectric layer 814 can left on the nonplanar device as shown in FIG. 8G and become part of the "back end" or interlayer dielectric (ILD) and metalization system used to electrically couple various nonplanar devices together into functional circuits. Alternatively, dielectric layer 814 can be removed at this time and replaced by another type of interlayer dielectric for the "back end" . This completes this method of forming a nonplanar device having a fully wrapped around or partially wrapped around gate electrode.

Thus, nonplanar transistors with partially or fully wrapped around gate electrodes and their methods of fabrication have been described.

We claim:

1. A nonplanar semiconductor device comprising:
    a semiconductor body having a top surface opposite a bottom surface formed above an insulating substrate, wherein said semiconductor body has a pair of laterally opposite sidewalls;
    a gate dielectric formed on said top surface of said semiconductor body, on only a portion of said bottom surface of said semiconductor body, and on said laterally opposite sidewalls of said semiconductor body;
    a gate electrode formed on said gate dielectric on said top surface of said semiconductor body, adjacent to said gate dielectric on said laterally opposite sidewalls of said semiconductor body, and beneath said gate dielectric on said portion of said bottom surface of said semiconductor body, wherein said gate electrode has a pair of laterally opposite sidewalls oriented perpendicularly to said laterally opposite sidewalls of said semiconductor body, said gate electrode having a top portion and a bottom portion, and wherein said bottom portion of said gate electrode undercuts said top portion of said gate electrode along said pair of laterally opposite sidewalls of said gate electrode; and
    a pair of source/drain regions formed in said semiconductor body on opposite sides of said gate electrode.

2. The semiconductor device of claim 1 wherein said semiconductor body is a single crystalline silicon film.

3. The semiconductor device of claim 1 wherein said semiconductor body is selected from the group consisting of germanium, silicon germanium, gallium arsenide, InSb, GaP, GaSb and carbon nanotubes.

4. The semiconductor device of claim 1 wherein said gate electrode comprises a material selected from the group consisting of polycrystalline silicon, tungsten, tantalum, titanium, and metal nitrides.

5. The semiconductor device of claim 1 wherein said insulating substrate comprises an oxide film formed on a monocrystalline silicon substrate.

6. The semiconductor device of claim 1 wherein said semiconductor device further includes at least one additional semiconductor body having a top surface and a bottom surface, and a pair of laterally opposite sidewalls wherein a gate dielectric layer is formed on said top surface, said bottom surface and said sidewalls of said at least one additional semiconductor body, and wherein said gate electrode is formed on said gate dielectric on said top surface of said at least one additional semiconductor body, and adjacent to said gate dielectric on said laterally opposite sidewalls of said at least one additional semiconductor body, and beneath the gate dielectric on said bottom surface of said at least one additional semiconductor body.

7. A nonplanar semiconductor device comprising:
    a semiconductor body having a top surface opposite a bottom surface, said semiconductor body having laterally opposite sidewalls formed above an insulating substrate;
    a gate dielectric formed on said top surface of said semiconductor body, on said laterally opposite sidewalls of said semiconductor body, and on only a portion of said bottom surface of said semiconductor body;
    a gate electrode formed on said gate dielectric on said top surface of said semiconductor body, adjacent to said gate dielectric on said laterally opposite sidewalls of said semiconductor body, and beneath said gate dielectric on said portion of said bottom surface of said semiconductor body, wherein said gate electrode has a pair of laterally opposite sidewalls oriented perpendicularly to said laterally opposite sidewalls of said semiconductor body, said gate electrode having a top portion above said insulating substrate and a bottom portion formed in said insulating substrates and wherein said bottom portion of said gate electrode has a larger width than said top portion of said gate electrode along said pair of laterally opposite sidewalls of said gate electrode ; and
    a pair of source/drain regions formed in said semiconductor body on opposite sides of said gate electrode.

8. The semiconductor device of claim 7 wherein said semiconductor body is a single crystalline silicon film.

9. The semiconductor device of claim 7 wherein said semiconductor body is selected from the group consisting of germanium, silicon germanium, gallium arsenide, InSb, GaP, GaSb and carbon nanotubes.

10. The semiconductor device of claim 7 wherein said gate electrode comprises a material selected from the group consisting of polycrystalline silicon, tungsten, tantalum, titanium and metal nitrides.

11. The semiconductor device of claim 7 wherein said insulating substrate comprises an oxide film formed on a monocrystalline silicon substrate.

12. The semiconductor device of claim 7 wherein said semiconductor device further includes at least one additional semiconductor body having a top surface and a bottom surface, and a pair of laterally opposite sidewalls wherein a gate dielectric layer is formed on said top surface, said bottom surface and said sidewalls of said at least one additional semiconductor body, and wherein said gate electrode is formed on said gate dielectric on said top surface of said at least one additional semiconductor body, and adjacent to said gate dielectric on said laterally opposite sidewalls of said at least one additional semiconductor body, and beneath the gate dielectric on said bottom surface of said at least one additional semiconductor body.

* * * * *